(12) United States Patent
Fukuda

(10) Patent No.: US 12,721,007 B2
(45) Date of Patent: Aug. 25, 2026

(54) MANUFACTURING METHOD OF DISPLAY DEVICE AND MOTHER SUBSTRATE FOR DISPLAY DEVICE

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 357 days.

(21) Appl. No.: 18/398,139

(22) Filed: Dec. 28, 2023

(65) Prior Publication Data

US 2024/0276840 A1 Aug. 15, 2024

(30) Foreign Application Priority Data

Feb. 9, 2023 (JP) ................................ 2023-018506

(51) Int. Cl.

*H10K 59/80* (2023.01)
*G09G 3/3225* (2016.01)
*H10K 59/12* (2023.01)
*H10K 59/122* (2023.01)

(52) U.S. Cl.

CPC ......... *H10K 59/873* (2023.02); *G09G 3/3225* (2013.01); *H10K 59/1201* (2023.02); *H10K 59/122* (2023.02); *G09G 2300/0842* (2013.01); *G09G 2310/0262* (2013.01)

(58) Field of Classification Search

CPC ... H10K 59/122; H10K 71/851; H10K 59/873
See application file for complete search history.

(56) References Cited

U.S. PATENT DOCUMENTS

2004/0160170 A1 8/2004 Sato et al.
2009/0009069 A1 1/2009 Takata
2019/0165312 A1* 5/2019 Bae .......................... G09G 3/20
2019/0363275 A1 11/2019 Ochi et al.
2020/0136088 A1* 4/2020 Yang .................... H10K 59/124
2020/0176520 A1* 6/2020 Kim ..................... H10K 59/873
2022/0077251 A1* 3/2022 Choung ............... H10K 59/173
2023/0309367 A1* 9/2023 Tabatake .............. H10K 59/122
2024/0138212 A1* 4/2024 Saitoh ....................... G09F 9/30

(Continued)

FOREIGN PATENT DOCUMENTS

JP 2000-195677 A 7/2000
JP 2004-207217 A 7/2004
JP 2008-135325 A 6/2008

(Continued)

*Primary Examiner* — Evren Seven
(74) *Attorney, Agent, or Firm* — XSENSUS LLP

(57) ABSTRACT

According to one embodiment, a manufacturing method includes preparing a substrate including panel portions and a margin area, forming lower electrodes, forming a rib, forming a first partition in the margin area, forming a first stacked film, and forming a first sealing layer. The first stacked film is formed in an entire of the substrate and is divided into portions by the first partition. The first sealing layer continuously covers these portions. An end portion of the substrate is spaced apart from an end portion of the first sealing layer. The first stacked film is exposed from the first sealing layer in an area between the end portions of the substrate and the first sealing layer.

20 Claims, 22 Drawing Sheets

(56) References Cited

U.S. PATENT DOCUMENTS

| | | | | |
|---|---|---|---|---|
| 2024/0164153 | A1* | 5/2024 | Kawamura | H10K 59/126 |

FOREIGN PATENT DOCUMENTS

| | | | | | |
|---|---|---|---|---|---|
| JP | 2009-032673 | A | | 2/2009 | |
| JP | 2010-118191 | A | | 5/2010 | |
| KR | 20140066974 | A | * | 6/2014 | H10K 50/844 |
| KR | 20220167818 | A | * | 12/2022 | H01L 27/3276 |
| WO | 2018/179308 | A1 | | 10/2018 | |

* cited by examiner

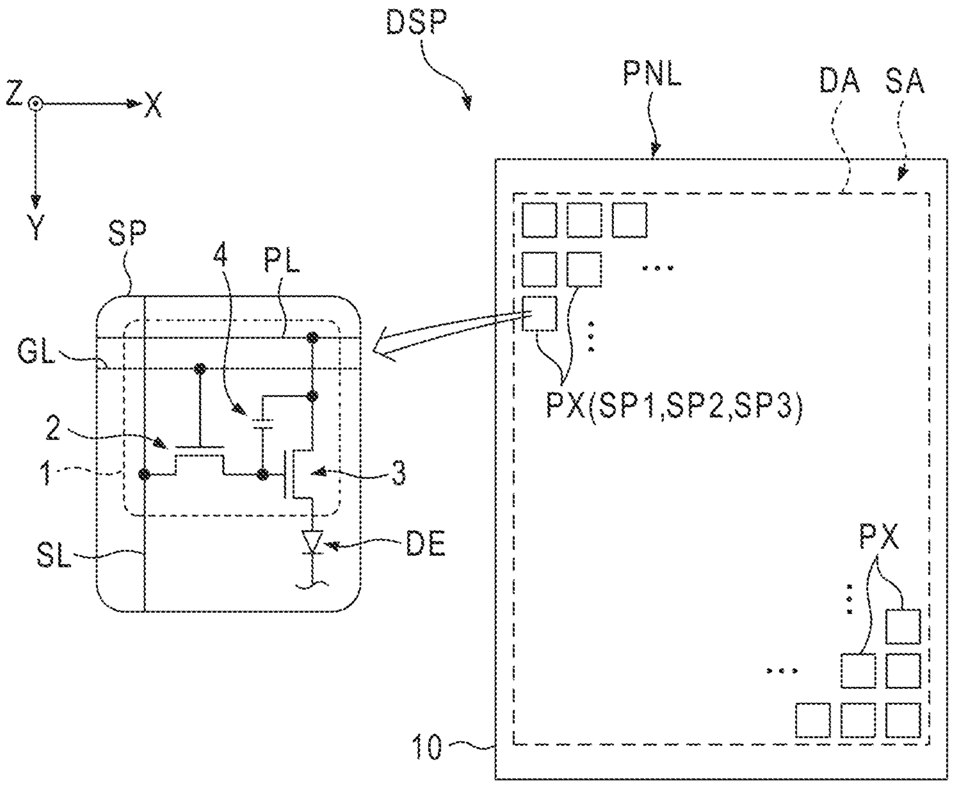
F I G. 1

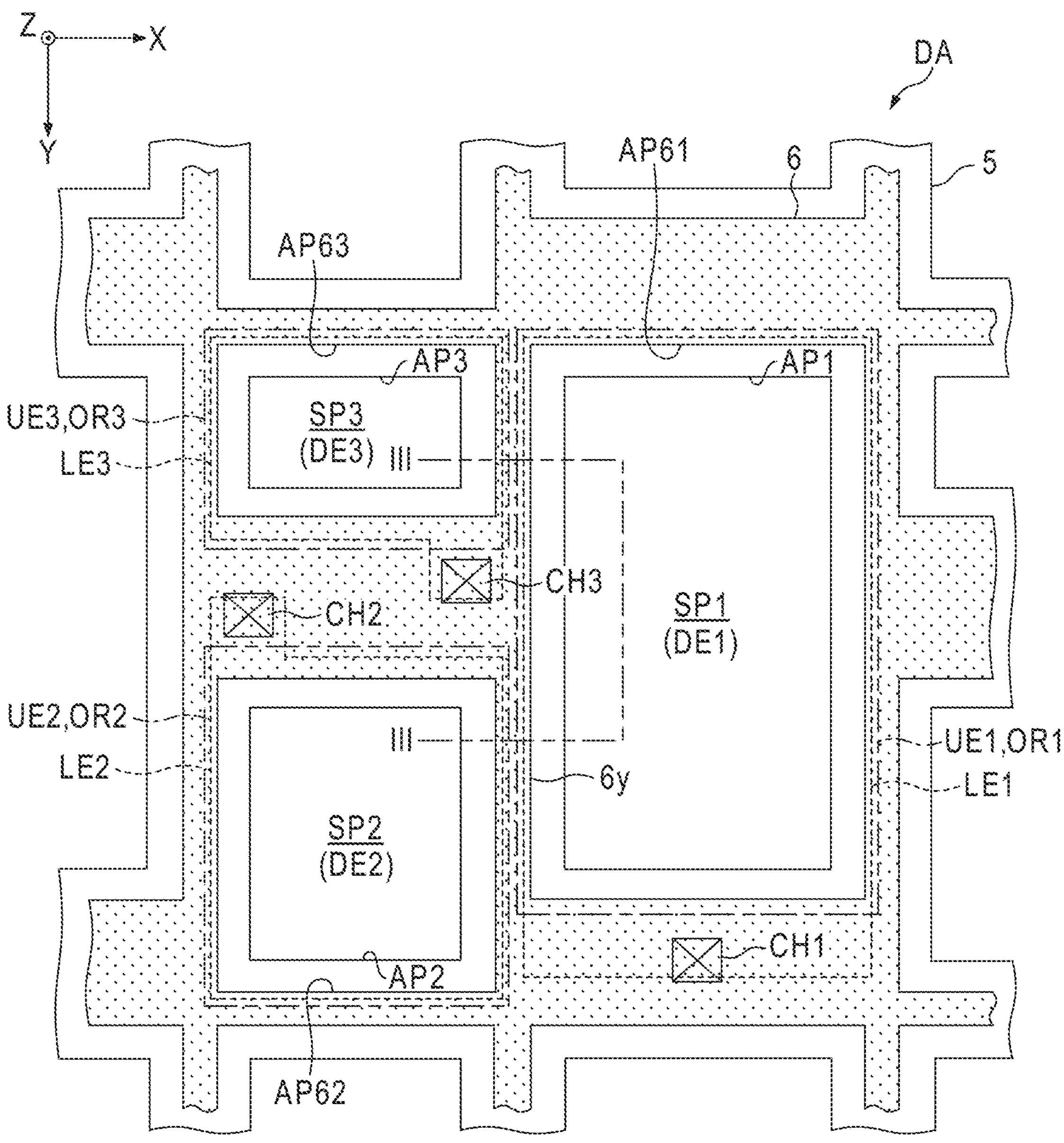
F I G. 2

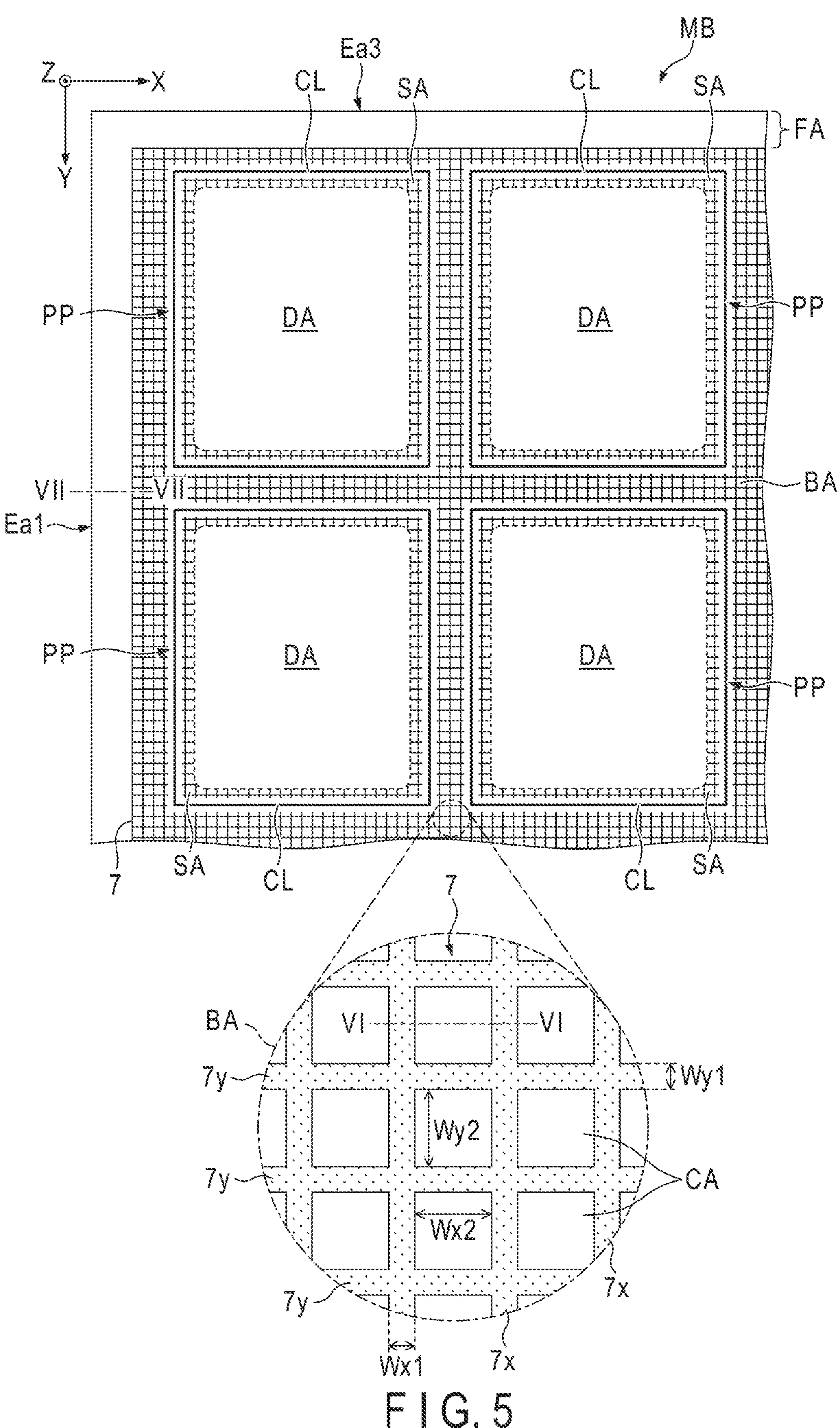
F I G. 5

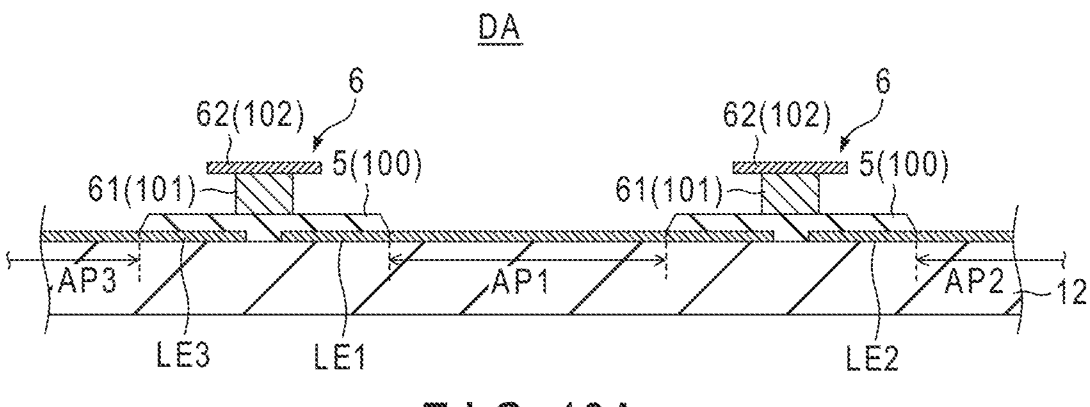
F I G. 10A
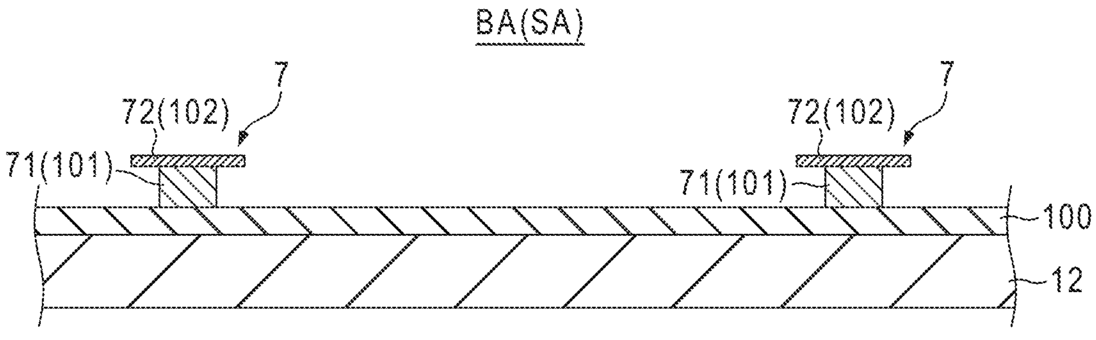
F I G. 10B

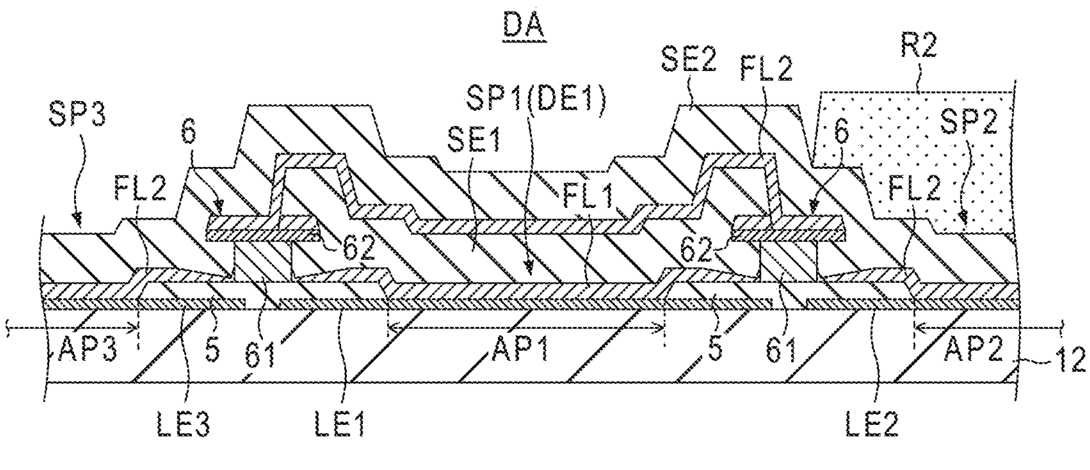
F I G. 13A
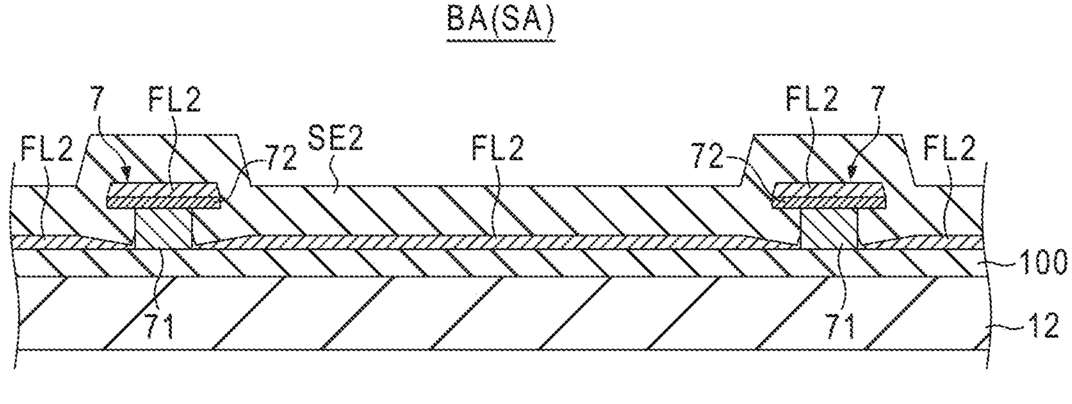
F I G. 13B

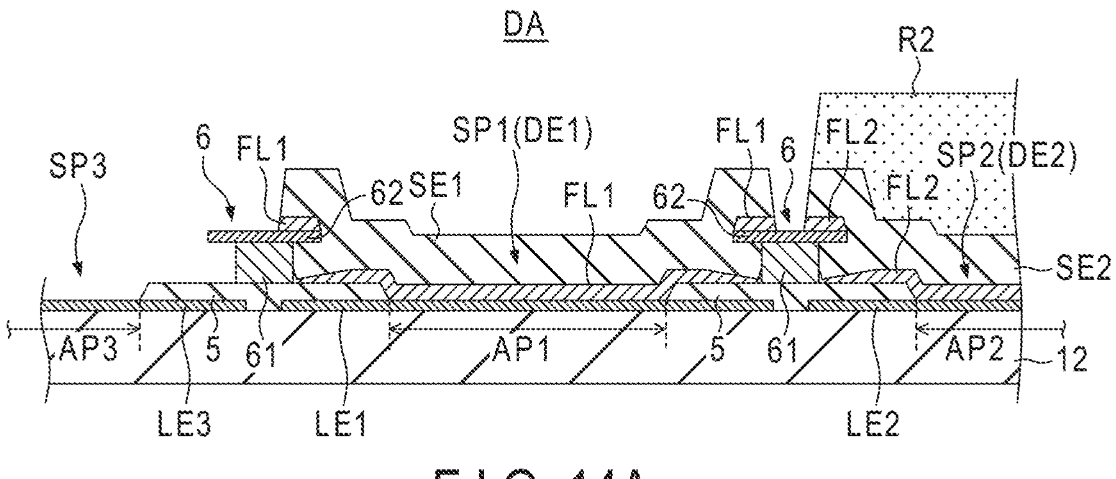
F I G. 14A
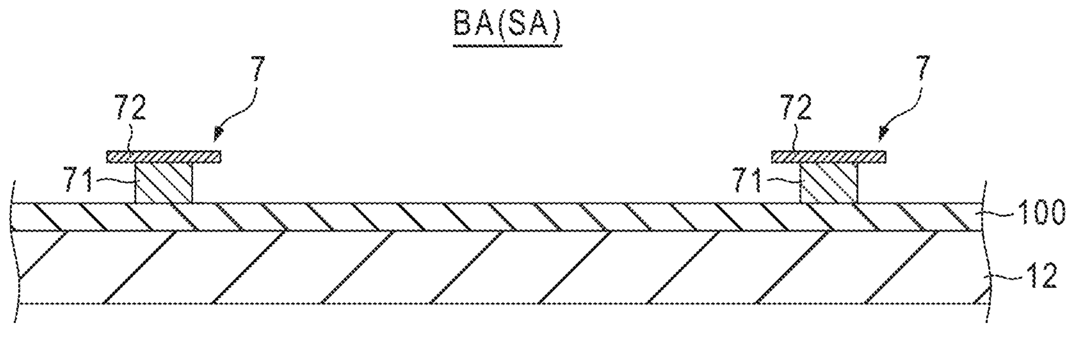
F I G. 14B

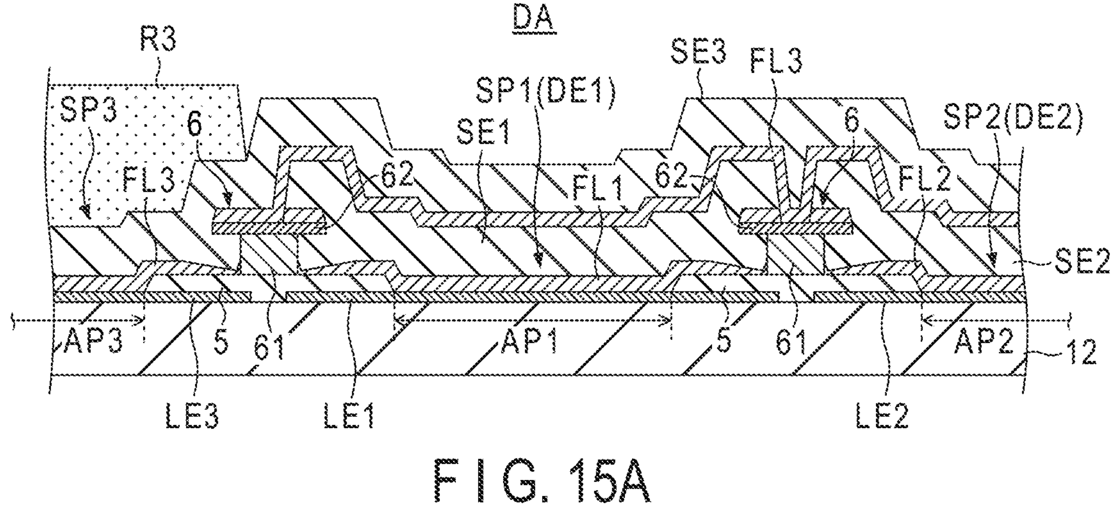
F I G. 15A
BA(SA)
F I G. 15B

BA(SA)
7
72
71
7
72
71
100
12

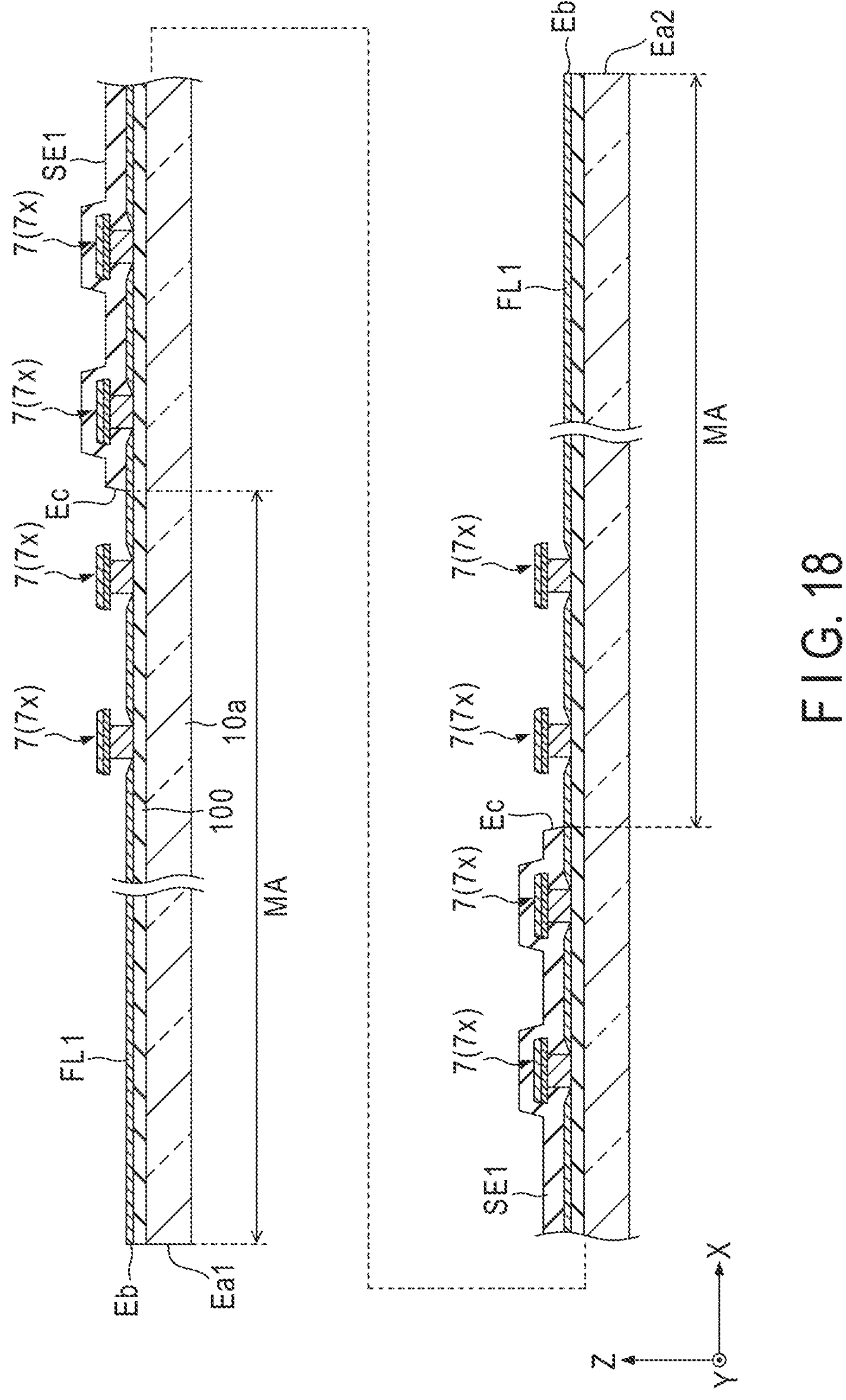
F I G. 18

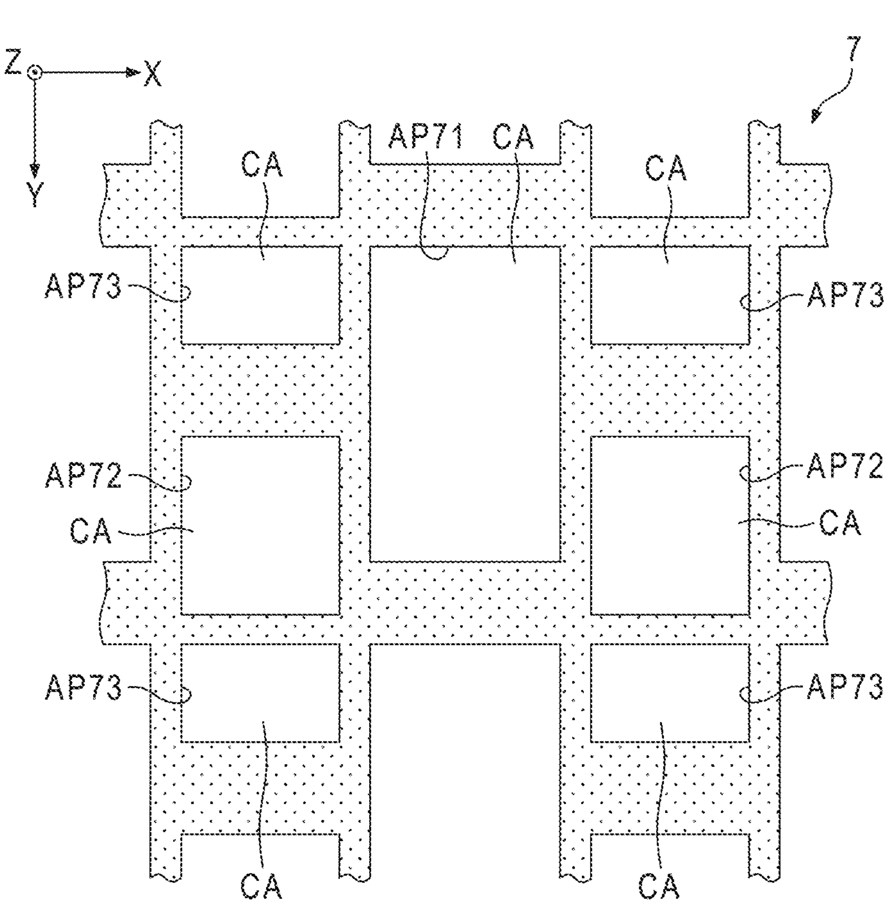
F I G. 24

MANUFACTURING METHOD OF DISPLAY DEVICE AND MOTHER SUBSTRATE FOR DISPLAY DEVICE

CROSS-REFERENCE TO RELATED APPLICATIONS

This application is based upon and claims the benefit of priority from Japanese Patent Application No. 2023-018506, filed Feb. 9, 2023, the entire contents of which are incorporated herein by reference.

FIELD

Embodiments described herein relate generally to a manufacturing method of a display device and a mother substrate for a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

When display devices are manufactured, a plurality of panel portions each including a display area in which a large number of display elements are provided are formed in a large mother substrate. Further, a display panel which is a main element of each display device is manufactured by cutting each panel portion out. In this manufacturing process, a technique for improving the yield is required.

BRIEF DESCRIPTION OF THE DRAWINGS

FIG. 1 is a diagram showing a configuration example of a display device according to a first embodiment.

FIG. 2 is a schematic plan view showing an example of the layout of subpixels.

FIG. 5 is a schematic plan view of part of the mother substrate according to the first embodiment.

FIG. 10A is a schematic cross-sectional view of the display area and shows a process following FIG. 9A.

FIG. 10B is a schematic cross-sectional view of the margin area and shows a process following FIG. 9B.

FIG. 13A is a schematic cross-sectional view of the display area and shows a process following FIG. 12A.

FIG. 13B is a schematic cross-sectional view of the margin area and shows a process following FIG. 12B.

FIG. 14A is a schematic cross-sectional view of the display area and shows a process following FIG. 13A.

FIG. 14B is a schematic cross-sectional view of the margin area and shows a process following FIG. 13B.

FIG. 15A is a schematic cross-sectional view of the display area and shows a process following FIG. 14A.

FIG. 15B is a schematic cross-sectional view of the margin area and shows a process following FIG. 14B.

FIG. 18 is a schematic cross-sectional view showing an example of the configuration of the vicinities of end portions of a substrate.

FIG. 24 is a schematic plan view of a partition according to a third embodiment.

DETAILED DESCRIPTION

Figure 3:
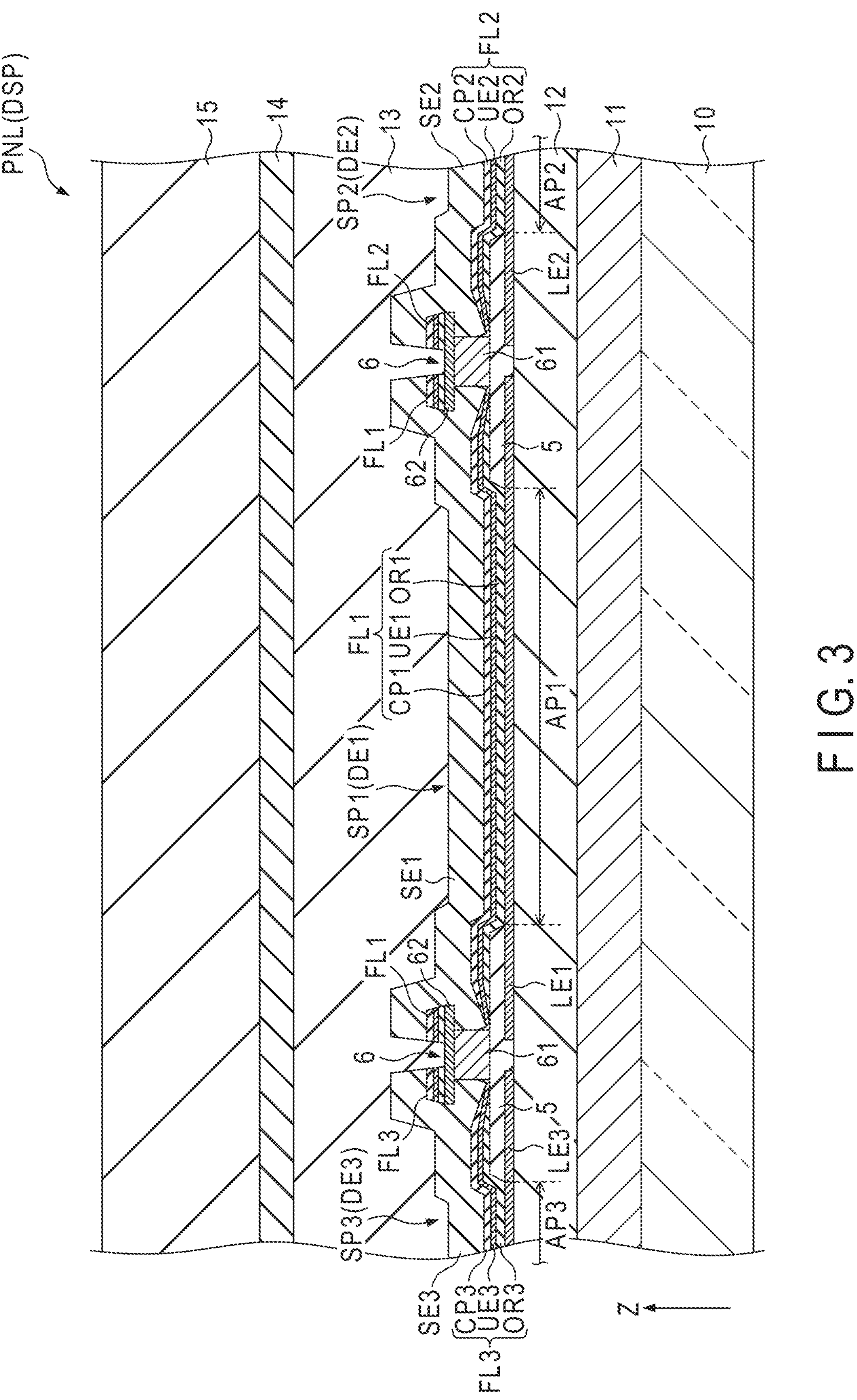
FIG. 3 is a schematic cross-sectional view of a display panel along the III-III line of FIG. 2.

In general, according to one embodiment, a manufacturing method of a display device includes preparing a substrate including a plurality of panel portions each of which includes a display area, and a margin area around the panel portions, forming a plurality of lower electrodes including a first lower electrode in the display area, forming a rib comprising a plurality of pixel apertures including a first pixel aperture overlapping the first lower electrode, forming a first partition including a first lower portion and a first upper portion comprising an end portion which protrudes from a side surface of the first lower portion in the margin area, forming a first stacked film including a first organic layer which is in contact with the lower electrodes through the pixel apertures, and a first upper electrode which covers the first organic layer, and forming a first sealing layer with an inorganic insulating material which covers the first stacked film. The first stacked film is formed in an entire of the substrate and is divided into a plurality of portions by the first partition. The first sealing layer continuously covers the plurality of portions. An end portion of the substrate is spaced apart from an end portion of the first sealing layer as seen in plan view. Further, the first stacked film is exposed from the first sealing layer in an area between the end portion of the substrate and the end portion of the first sealing layer.

Moreover, according to an embodiment, a mother substrate comprises a substrate including a plurality of panel portions each of which includes a display area, and a margin area around the panel portions, a lower electrode provided in the display area, a rib comprising a pixel aperture overlapping the lower electrode, a first partition formed in the margin area and including a first lower portion and a first upper portion comprising an end portion which protrudes from a side surface of the first lower portion, a stacked film including an organic layer which is in contact with the lower electrode through the pixel aperture, and an upper electrode which covers the organic layer, and a sealing layer formed of an inorganic insulating material which covers the stacked film. The stacked film is formed in the panel portions and the margin area and is divided into a plurality of portions by the first partition. The sealing layer continuously covers the plurality of portions.

According to an aspect of the embodiment, an end portion of the substrate is spaced apart from an end portion of the sealing layer as seen in plan view. Further, the stacked film is exposed from the sealing layer in an area between the end portion of the substrate and the end portion of the sealing layer.

According to another aspect of the embodiment, an end portion of the stacked film is aligned with the end portion of the sealing layer as seen in plan view. Further, each of the end portion of the stacked film and the end portion of the sealing layer is spaced apart from the end portion of the substrate as seen in plan view.

According to the manufacturing method of the display device and the mother substrate for the display device in the embodiments, the manufacturing yield of the display device can be improved.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. The third direction Z is a normal direction relative to a plane including the first direction X and the second direction Y. When various elements are viewed parallel to the third direction Z, the appearance is defined as a plan view.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

First Embodiment

FIG. 1 is a diagram showing a configuration example of a display device DSP according to a first embodiment. The display device DSP comprises a display panel PNL including an insulating substrate 10. The display panel PNL comprises a display area DA which displays an image, and a surrounding area SA around the display area DA. The substrate 10 may be glass or a resinous film having flexibility.

In the embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

FIG. 2 is a schematic plan view showing an example of the layout of subpixels SP1, SP2 and SP3. In the example of FIG. 2, each of subpixels SP2 and SP3 is adjacent to subpixel SP1 in the first direction X. Further, subpixels SP2 and SP3 are arranged in the second direction Y.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X. It should be noted that the layout of subpixels SP1, SP2 and SP3 is not limited to the example of FIG. 2.

A rib 5 is provided in the display area DA. The rib 5 comprises pixel apertures (first to third pixel apertures) AP1, AP2 and AP3 in subpixels SP1, SP2 and SP3, respectively. In the example of FIG. 2, the pixel aperture AP1 is larger than the pixel aperture AP2. The pixel aperture AP2 is larger than the pixel aperture AP3.

Subpixel SP1 comprises a lower electrode (first lower electrode) LE1, an upper electrode (first upper electrode) UE1 and an organic layer (first organic layer) OR1 overlapping the pixel aperture AP1. Subpixel SP2 comprises a lower electrode (second lower electrode) LE2, an upper electrode (second upper electrode) UE2 and an organic layer (second organic layer) OR2 overlapping the pixel aperture AP2. Subpixel SP3 comprises a lower electrode (third lower electrode) LE3, an upper electrode (third upper electrode) UE3 and an organic layer (third organic layer) OR3 overlapping the pixel aperture AP3.

Of the lower electrode LE1, the upper electrode UE1 and the organic layer OR1, the portions which overlap the pixel aperture AP1 constitute the display element (first display element) DE1 of subpixel SP1. Of the lower electrode LE2, the upper electrode UE2 and the organic layer OR2, the portions which overlap the pixel aperture AP2 constitute the display element (second display element) DE2 of subpixel SP2. Of the lower electrode LE3, the upper electrode UE3 and the organic layer OR3, the portions which overlap the pixel aperture AP3 constitute the display element (third display element) DE3 of subpixel SP3. Each of the display elements DE1, DE2 and DE3 may further include a cap layer as described later. The rib 5 surrounds each of these display elements DE1, DE2 and DE3.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

A partition 6 is provided on the rib 5. The partition 6 overlaps the rib 5 as a whole and has the same planar shape as the rib 5. In other words, the partition 6 comprises apertures AP61, AP62 and AP63 in subpixels SP1, SP2 and SP3, respectively. From another viewpoint, the rib 5 and the partition 6 are provided between the display elements DE1, DE2 and DE3, and have grating shapes as seen in plan view.

FIG. 3 is a schematic cross-sectional view of the display panel PNL along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1.

The circuit layer 11 is covered with an organic insulating layer 12. The organic insulating layer 12 functions as a planarization film which planarizes the irregularities formed by the circuit layer 11. Although not shown in the section of FIG. 3, the contact holes CH1, CH2 and CH3 described above are provided in the organic insulating layer 12.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5.

The partition 6 includes a conductive lower portion 61 provided on the rib 5 and an upper portion 62 provided on the lower portion 61. The upper portion 62 has a width greater than that of the lower portion 61. By this configuration, the both end portions of the upper portion 62 protrude relative to the side surfaces of the lower portion 61. This shape of the partition 6 is called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3. The upper electrodes UE1, UE2 and UE3 are in contact with the side surfaces of the lower portion 61 of the partition 6.

In the example of FIG. 3, a cap layer (first cap layer) CP1 is provided on the upper electrode UE1. A cap layer (second cap layer) CP2 is provided on the upper electrode UE2. A cap layer (third cap layer) CP3 is provided on the upper electrode UE3. The cap layers CP1, CP2 and CP3 function as optical adjustment layers which improve the extraction efficiency of the light emitted from the organic layers OR1, OR2 and OR3, respectively.

In the following explanation, a multilayer body including the organic layer OR1, the upper electrode UE1 and the cap layer CP1 is called a stacked film (first stacked film) FL1. A multilayer body including the organic layer OR2, the upper electrode UE2 and the cap layer CP2 is called a stacked film (second stacked film) FL2. A multilayer body including the organic layer OR3, the upper electrode UE3 and the cap layer CP3 is called a stacked film (third stacked film) FL3.

The stacked film FL1 is partly located on the upper portion 62. This portion is spaced apart from, of the stacked film FL1, the portion located under the partition 6 (in other words, the portion which constitutes the display element DE1). Similarly, the stacked film FL2 is partly located on the upper portion 62. This portion is spaced apart from, of the stacked film FL2, the portion located under the partition 6 (in other words, the portion which constitutes the display element DE2). Further, the stacked film FL3 is partly located on the upper portion 62. This portion is spaced apart from, of the stacked film FL3, the portion located under the partition 6 (in other words, the portion which constitutes the display element DE3).

Sealing layers (first to third sealing layers) SE1, SE2 and SE3 are provided in subpixels SP1, SP2 and SP3, respectively. The sealing layer SE1 continuously covers the stacked film FL1 and the partition 6 around subpixel SP1. The sealing layer SE2 continuously covers the stacked film FL2 and the partition 6 around subpixel SP2. The sealing layer SE3 continuously covers the stacked film FL3 and the partition 6 around subpixel SP3.

In the example of FIG. 3, the stacked film FL1 and sealing layer SE1 located on the partition 6 between subpixels SP1 and SP2 are spaced apart from the stacked film FL2 and sealing layer SE2 located on this partition 6. The stacked film FL1 and sealing layer SE1 located on the partition 6 between subpixels SP1 and SP3 are spaced apart from the stacked film FL3 and sealing layer SE3 located on this partition 6.

The sealing layers SE1, SE2 and SE3 are covered with a resin layer 13. The resin layer 13 is covered with a sealing layer 14. The sealing layer 14 is covered with a resin layer 15. The resin layers 13 and 15 and the sealing layer 14 are continuously provided in at least the entire display area DA and partly extend in the surrounding area SA as well.

A cover member such as a polarizer, a touch panel, a protective film or a cover glass may be further provided above the resin layer 15. This cover member may be attached to the resin layer 15 via, for example, an adhesive layer such as an optical clear adhesive (OCA).

The organic insulating layer 12 is formed of an organic insulating material such as polyimide. Each of the rib 5 and the sealing layers 14, SE1, SE2 and SE3 is formed of an inorganic insulating material such as silicon nitride (SiNx), silicon oxide (SiOx), silicon oxynitride (SiON) or aluminum oxide ($Al_2O_3$). For example, the rib 5 is formed of silicon oxynitride, and each of the sealing layers 14, SE1, SE2 and SE3 is formed of silicon nitride. Each of the resin layers 13 and 15 is formed of, for example, a resinous material (organic insulating material) such as epoxy resin or acrylic resin.

Each of the lower electrodes LE1, LE2 and LE3 comprises a reflective layer formed of, for example, silver (Ag), and a pair of conductive oxide layers covering the upper and lower surfaces of the reflective layer. Each conductive oxide layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may comprise a tandem structure including a plurality of light emitting layers.

Each of the cap layers CP1, CP2 and CP3 comprises, for example, a multilayer structure in which a plurality of transparent thin films are stacked. The thin films may include a thin film formed of an inorganic material and a thin film formed of an organic material. These thin films have refractive indices different from each other. For example, the refractive indices of these thin films are different from the refractive indices of the upper electrodes UE1, UE2 and UE3 and the refractive indices of the sealing layers SE1, SE2 and SE3. It should be noted that at least one of the cap layers CP1, CP2 and CP3 may be omitted.

The lower portion 61 of the partition 6 is formed of, for example, aluminum. The lower portion 61 may be formed of an aluminum alloy such as an aluminum-neodymium alloy (AlNd), an aluminum-yttrium alloy (AlY) or an aluminum-silicon alloy (AlSi), or may comprise a multilayer structure consisting of an aluminum layer and an aluminum alloy layer. Further, the lower portion 61 may comprise a bottom layer formed of a metal material different from aluminum and an aluminum alloy under the aluminum layer or the aluminum alloy layer. For the metal material forming the bottom layer, for example, molybdenum (Mo), titanium nitride (TiN), a molybdenum-tungsten alloy (MoW) or a molybdenum-niobium alloy (MoNb) may be used.

For example, the upper portion 62 of the partition 6 comprises a multilayer structure consisting of a lower layer formed of a metal material and an upper layer formed of conductive oxide. For the metal material forming the lower layer, for example, titanium, titanium nitride, molybdenum, tungsten, a molybdenum-tungsten alloy or a molybdenum-niobium alloy may be used. For the conductive oxide forming the upper layer, for example, ITO or IZO may be used. It should be noted that the upper portion 62 may comprise a single-layer structure of a metal material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

When the display device DSP is manufactured, a large mother substrate in which a plurality of areas (panel portions) each corresponding to the display panel PNL are formed is prepared. A configuration which could be applied to this mother substrate is explained below.

Figure 4:
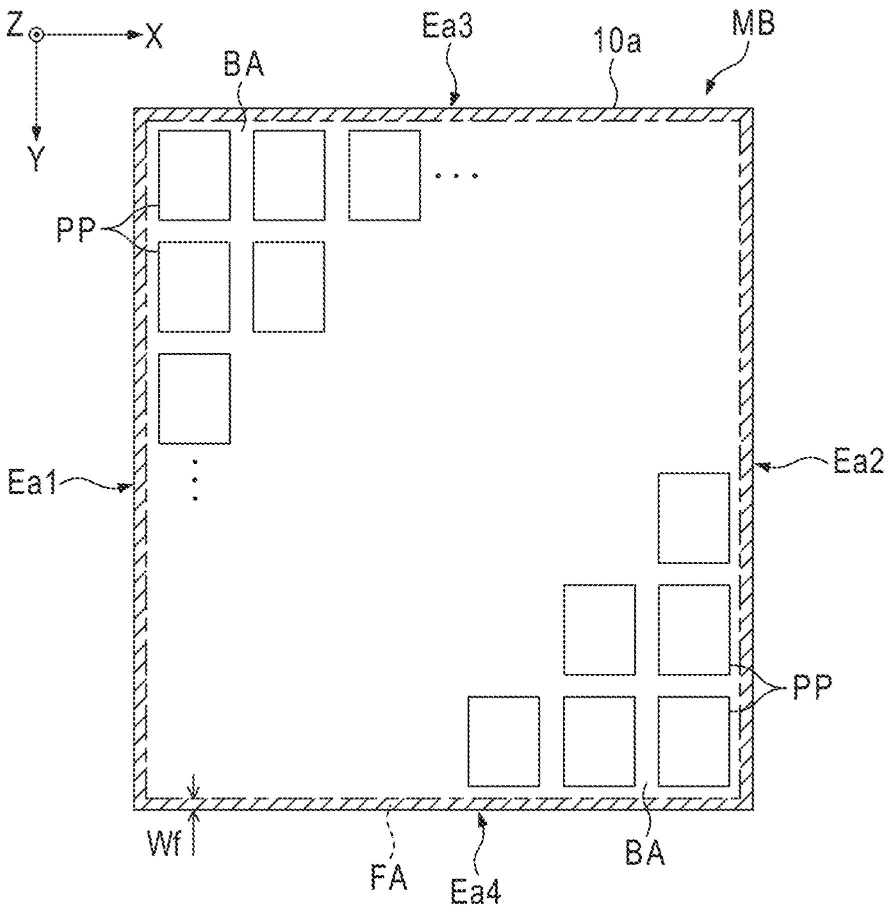
FIG. 4 is a schematic plan view of a mother substrate according to the first embodiment.

FIG. 4 is a schematic plan view of a mother substrate MB (a mother substrate for a display device) according to the embodiment. The mother substrate MB comprises an insulating substrate 10*a* which is a base. In the example of FIG. 4, the substrate 10*a* is a rectangle comprising linear end portions Ea1 and Ea2 parallel to the second direction Y, and linear end portions Ea3 and Ea4 parallel to the first direction X. However, the shape of the mother substrate MB is not limited to a rectangle.

The substrate 10*a* comprises a plurality of panel portions PP provided in matrix, and a margin area BA around these panel portions PP. The margin area BA includes an outer circumferential area FA along the end portions Ea1, Ea2, Ea3 and Ea4. The outer circumferential area FA is, for example, an area extending over a predetermined distance from the end portions Ea1, Ea2, Ea3 and Ea4 and does not include the partition 7 described later. Width Wf of the outer circumferential area FA is, for example, constant over the whole circumference. However, the width is not limited to this example. For example, width Wf is greater than or equal to 5 mm, and may be specifically approximately 10 mm.

FIG. 5 is a schematic plan view of part of the mother substrate MB. The outer shape of each panel portion PP corresponds to a cut line CL for cutting the panel portion PP from the mother substrate MB. Each panel portion PP comprises the display area DA and surrounding area SA described above.

As shown in the enlarged view of FIG. 5, a partition 7 (the portion with a dot pattern) is provided in the margin area BA. The partition 7 comprises a plurality of first linear portions 7*x* provided parallel to each other, and a plurality of second linear portions 7*y* provided parallel to each other.

The first linear portions 7*x* extend in the second direction Y and are arranged in the first direction X. The second linear portions 7*y* extend in the first direction X and are arranged in the second direction Y. In the example of FIG. 5, the first linear portions 7*x* and the second linear portions 7*y* intersect each other. In this configuration, the partition 7 has a grating shape as a whole.

From another viewpoint, the partition 7 forms a plurality of closed areas CA. Each of the closed areas CA is a square or rectangular area surrounded by adjacent two first linear portions 7*x* and adjacent two second linear portions 7*y*.

Each of the first linear portions 7*x* has width Wx1 in the first direction X. Each of the second linear portions 7*y* has width Wy1 in the second direction Y. Each of the closed areas CA has width Wx2 in the first direction X and has width Wy2 in the second direction Y. Width Wx2 corresponds to the layout interval of the first linear portions 7*x*. Width Wy2 corresponds to the layout interval of the second linear portions 7*y*.

For example, width Wx2 is greater than the width of each of subpixels SP1, SP2 and SP3 in the first direction X. Width Wy2 is greater than the width of each of subpixels SP1, SP2 and SP3 in the second direction Y. In the example of FIG. 5, widths Wx2 and Wy2 are greater than widths Wx1 and Wy1, respectively (Wx2>Wx1, Wy2>Wy1). As explained in detail later, at least one of widths Wx2 and Wy2 should be preferably less than or equal to 200 μm (Wx2, Wy2≤200 μm).

The pattern of the grating shape of the mother substrate MB in FIG. 5 shows the area in which the partition 7 is provided. In other words, in the example of FIG. 5, the partition 7 is provided in the surrounding areas SA in addition to the margin area BA. The partition 7 provided in the surrounding areas SA remains in the panel portions PP (display panels PNL) even after the panel portions PP are cut out along the cut lines CL. The partition 7 is not provided in the display areas DA. In addition, the partition 7 is not provided in the outer circumferential area FA in the margin area BA.

To efficiently cut the panel portions PP out, preferably, the partition 7 should not be provided in the cut lines CL. In this case, the partition 7 provided in the surrounding areas SA and the partition 7 provided in the margin area BA are divided from each other in the boundaries between the surrounding areas SA and the margin area BA.

It should be noted that the partition 7 may not be necessarily provided in the entire surrounding areas SA. The margin area BA may include an area in which the partition 7 is not provided in addition to the outer circumferential area FA.

Figure 6:
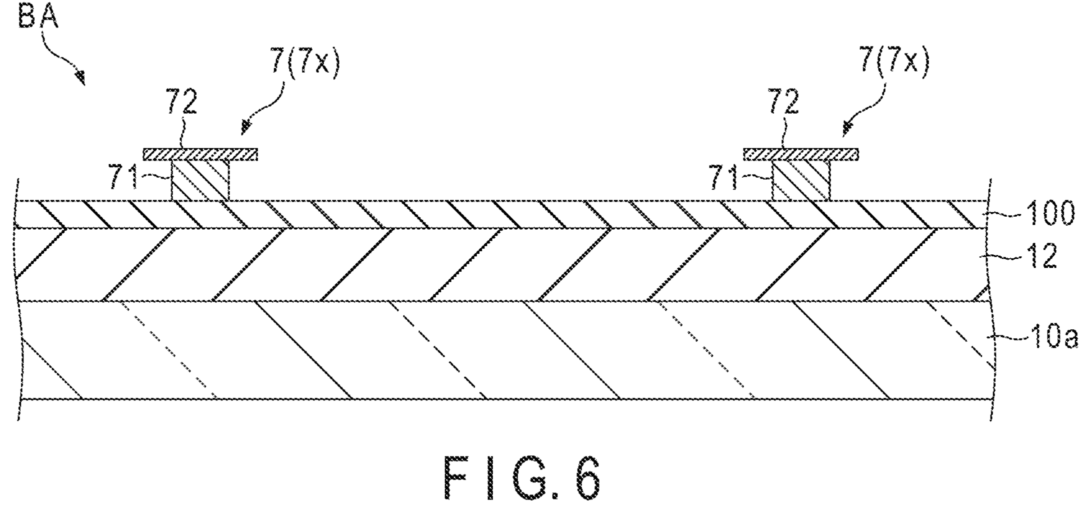
FIG. 6 is a schematic cross-sectional view of a margin area along the VI-VI line of FIG. 5.

FIG. 6 is a schematic cross-sectional view of the margin area BA along the VI-VI line of FIG. 5. The mother substrate MB comprises the substrate 10*a* described above. When the panel portions PP are cut out from the mother substrate MB, the substrate 10*a* is cut along the cut lines CL. The substrate 10*a* of each panel portion PP which has been cut out corresponds to the substrate 10 shown in FIG. 3, etc.

The mother substrate MB comprises an inorganic insulating layer 100 provided above the substrate 10*a* in the margin area BA. The inorganic insulating layer 100 is formed of, for example, the same material as the rib 5. The inorganic insulating layer 100 and the rib 5 may be formed integrally with each other. The inorganic insulating layer 100 and the rib 5 may be divided from each other along the cut line CL. In the example of FIG. 6, the organic insulating layer 12 is provided between the substrate 10*a* and the inorganic insulating layer 100.

The partition 7 includes a lower portion 71 provided on the inorganic insulating layer 100 and an upper portion 72 provided on the lower portion 71. The upper portion 72 has a width which is greater than that of the lower portion 71. By this configuration, the both end portions of the upper portion 72 protrude relative to the side surfaces of the lower portion 71. Thus, the partition 7 has an overhang shape in the same manner as the partition 6 shown in FIG. 3. For example, the lower and upper portions 71 and 72 of the partition 7 are formed of the same materials as the lower and upper portions 61 and 62 of the partition 6, respectively.

It should be noted that the structure of the margin area BA is not limited to the example of FIG. 6. Another insulating layer or conductive layer may be interposed between the substrate 10*a* and the organic insulating layer 12. The organic insulating layer 12 may be removed in at least part of the margin area BA. The inorganic insulating layer 100 and the partition 7 may be covered with another insulating layer or conductive layer.

Figure 7:
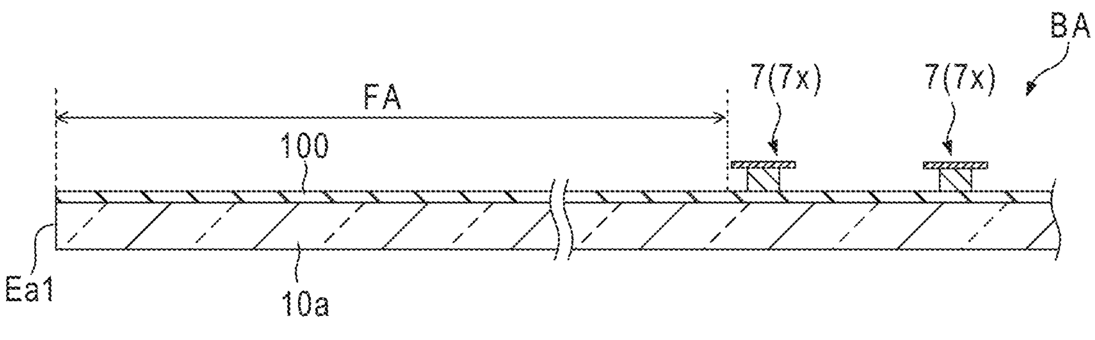
FIG. 7 is a schematic cross-sectional view of the margin area along the VII-VII line of FIG. 5.

FIG. 7 is a schematic cross-sectional view of the margin area BA along the VII-VII line of FIG. 5. In the example of FIG. 7, the organic insulating layer 12 is not provided between the substrate 10*a* and the inorganic insulating layer 100. However, in a manner similar to that of the example of FIG. 6, the organic insulating layer 12 may be provided. Further, in the example of FIG. 7, the inorganic insulating layer 100 covers the entire substrate 10*a*. However, the substrate 10*a* may comprise an area which is not covered with the inorganic insulating layer 100 near the end portion Ea1.

A cross-sectional structure similar to that of FIG. 7 can be applied to the vicinities of the other end portions Ea2, Ea3 and Ea4 of the substrate 10*a*. In the section of FIG. 7, the outer circumferential area FA corresponds to the area between, of the first linear portions 7*x* of the partition 7, the first linear portion 7*x* which is the closest to the end portion Ea1 and the end portion Ea1. Similarly, the other portions of the outer circumferential area FA correspond to the areas between the first linear portion 7*x* or second linear portions 7*y* which are the closest to the end portions Ea2, Ea3 and Ea4 and these end portions Ea2, Ea3 and Ea4.

Now, this specification explains the manufacturing method of the mother substrate MB and the display device DSP.

Figure 8:
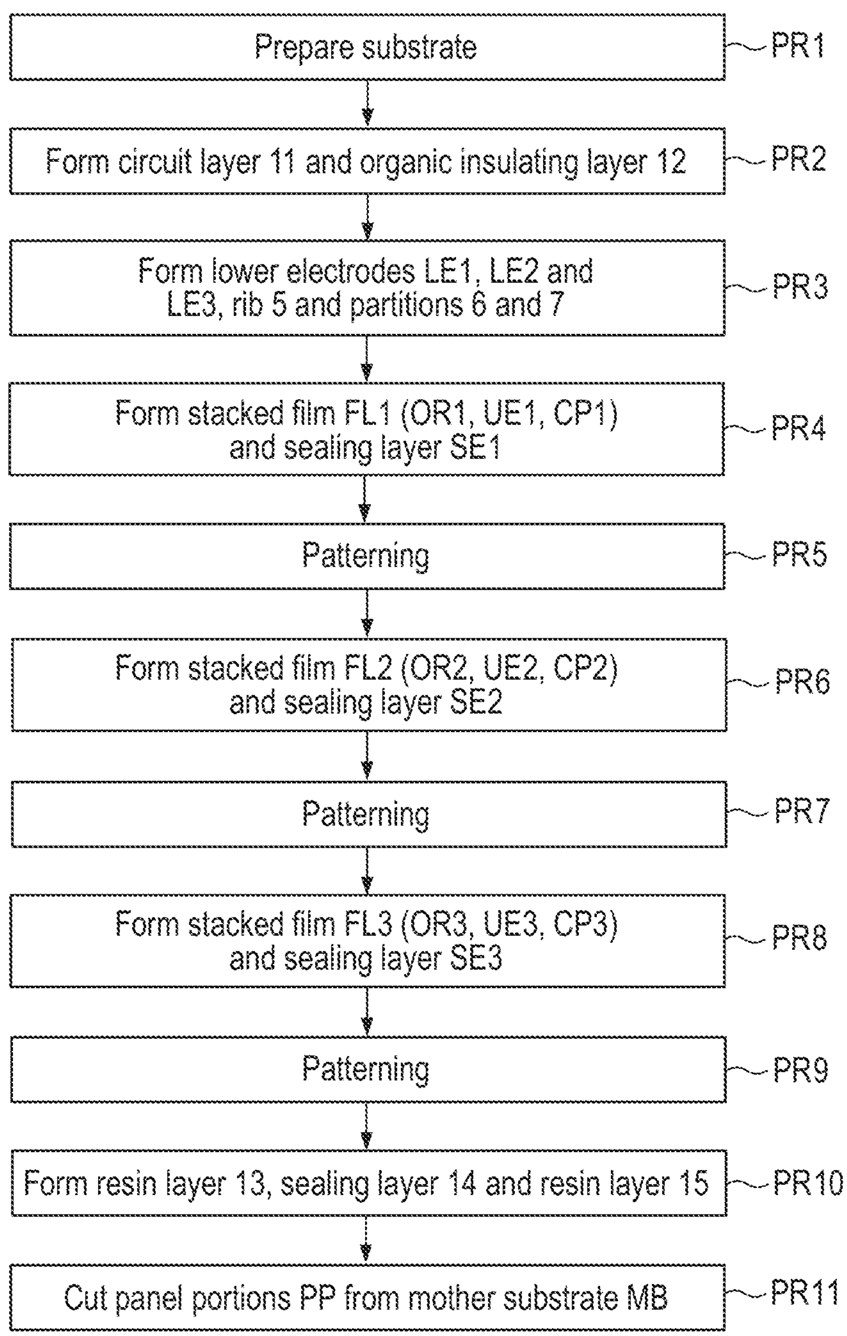
FIG. 8 is a flowchart showing an example of the manufacturing method of the mother substrate and the display device according to the first embodiment.

FIG. 8 is a flowchart showing an example of the manufacturing method of the mother substrate MB and the display device DSP. Each of FIG. 9A to FIG. 16A is a schematic cross-sectional view of the display area DA in the mother substrate MB during the manufacturing process. Each of FIG. 9B to FIG. 16B is a schematic cross-sectional view of the margin area BA in the mother substrate MB during the manufacturing process. The same manufacturing process as FIG. 9B to FIG. 16B can be applied to the surrounding area SA. It should be noted that the substrate 10*a* and the circuit layer 11 are omitted in FIG. 9A to FIG. 16A and FIG. 9B to FIG. 16B.

To manufacture the display device DSP, first, the large substrate 10*a* including areas corresponding to a plurality of panel portions PP and the margin area BA is prepared (process PR1). Subsequently, the circuit layer 11 and the organic insulating layer 12 are formed on the substrate 10*a* (process PR2).

After process PR2, the lower electrodes LE1, LE2 and LE3, the rib 5, the partition 6 and the partition 7 are formed (process PR3). The flow of process PR3 in the embodiment is as shown in FIG. 9A, FIG. 9B, FIG. 10A and FIG. 10B.

Figure 9A:
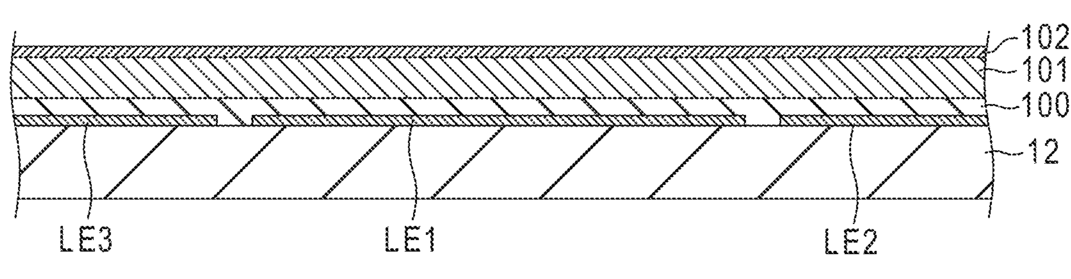
FIG. 9A is a schematic cross-sectional view of a display area in the mother substrate during the manufacturing process.
Figure 9B:
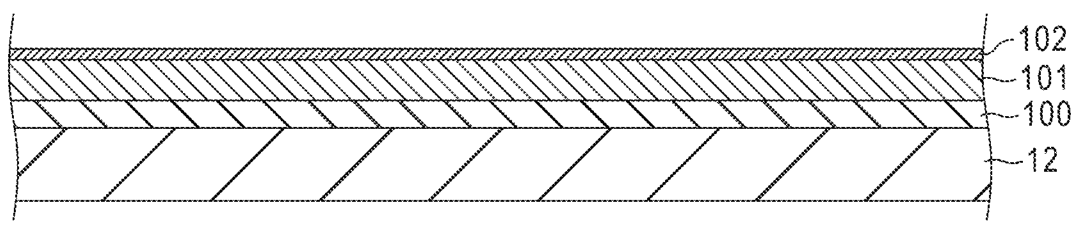
FIG. 9B is a schematic cross-sectional view of the margin area in the mother substrate during the manufacturing process.

Specifically, as shown in FIG. 9A and FIG. 9B, the inorganic insulating layer 100 which should be processed into the rib 5 is formed in the entire mother substrate MB. Further, a first layer 101 which should be processed into the lower portions 61 and 71 is formed on the inorganic insulating layer 100. A second layer 102 which should be processed into the upper portions 62 and 72 is formed on the first layer 101.

Subsequently, as shown in FIG. 10A and FIG. 10B, the first layer 101 and the second layer 102 are patterned. This patterning includes etching for processing the second layer 102 into the shapes of the upper portions 62 and 72 and etching for processing the first layer 101 into the shapes of the lower portion 61 and 71. By these etching processes, the partition (first partition) 7 including the lower portion (first lower portion) 71 and the upper portion (first upper portion) 72 is formed in the margin area BA and the surrounding area SA, and further, the partition (second partition) 6 including the lower portion (second lower portion) 61 and the upper portion (second upper portion) 62 is formed in the display area DA.

After the formation of the partitions 6 and 7, as shown in FIG. 10A, the pixel apertures AP1, AP2 and AP3 are formed in the inorganic insulating layer 100. By this process, the rib 5 is formed in the display area DA. FIG. 9A and FIG. 10A show a case where the pixel apertures AP1, AP2 and AP3 are formed after the formation of the partition 6. As another example, the partition 6 may be formed after the formation of the pixel apertures AP1, AP2 and AP3.

After the formation of the rib 5, the partition 6 and the partition 7, a process for forming the display elements DE1, DE2 and DE3 is performed. In the embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

Figure 11A:
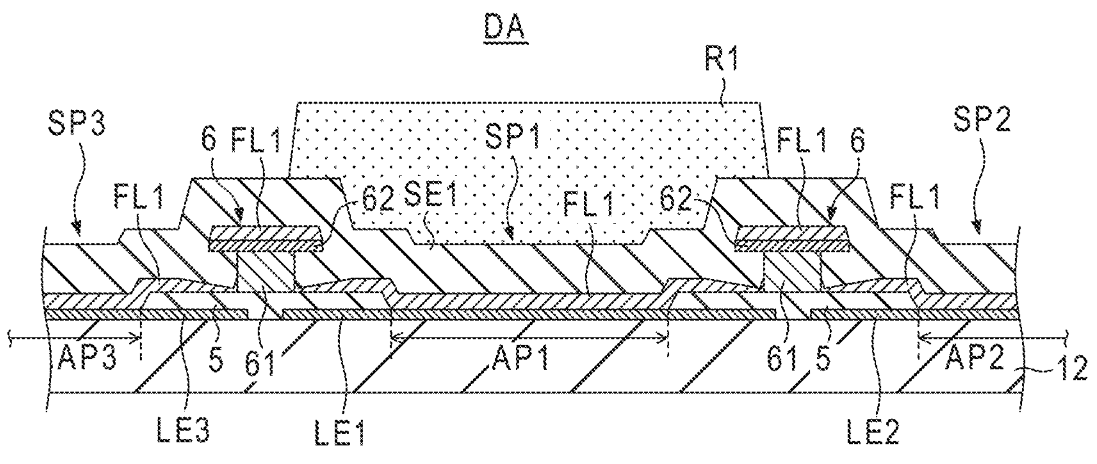
FIG. 11A is a schematic cross-sectional view of the display area and shows a process following FIG. 10A.
Figure 11B:
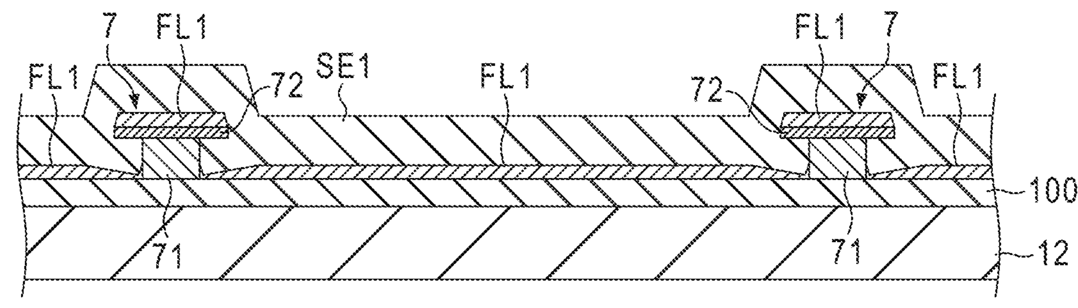
FIG. 11B is a schematic cross-sectional view of the margin area and shows a process following FIG. 10B.

To form the display element DE1, first, as shown in FIG. 11A and FIG. 11B, the stacked film FL1 and the sealing layer SE1 are formed in each panel portion PP and the margin area BA (process PR4). The stacked film FL1 includes, as shown in FIG. 3, the organic layer OR1 which is in contact with the lower electrode LE1 through the pixel aperture AP1, the upper electrode UE1 which covers the organic layer OR1 and the cap layer CP1 which covers the upper electrode UE1. The organic layer OR1, the upper electrode UE1 and the cap layer CP1 are formed by vapor deposition. The sealing layer SE1 is formed by chemical vapor deposition (CVD).

The stacked film FL1 is divided into a plurality of portions by the partitions 6 and 7 having overhang shapes. As shown in FIG. 11A, the stacked film FL1 in the display area DA covers the lower electrodes LE1, LE2 and LE3 exposed through the pixel apertures AP1, AP2 and AP3, the rib 5 and the partition 6. As shown in FIG. 11B, the stacked film FL1 in the margin area BA and the surrounding area SA covers the inorganic insulating layer 100 and the partition 7. The sealing layer SE1 continuously covers the divided portions of the stacked film FL1 and the partitions 6 and 7.

After process PR4, the stacked film FL1 and the sealing layer SE1 are patterned (process PR5). In this patterning, as shown in FIG. 11A, a resist R1 is provided on the sealing layer SE1. The resist R1 covers subpixel SP1 and part of the partition 6 around the subpixel. The resist R1 is not provided in the margin area BA or the surrounding area SA.

Figure 12A:
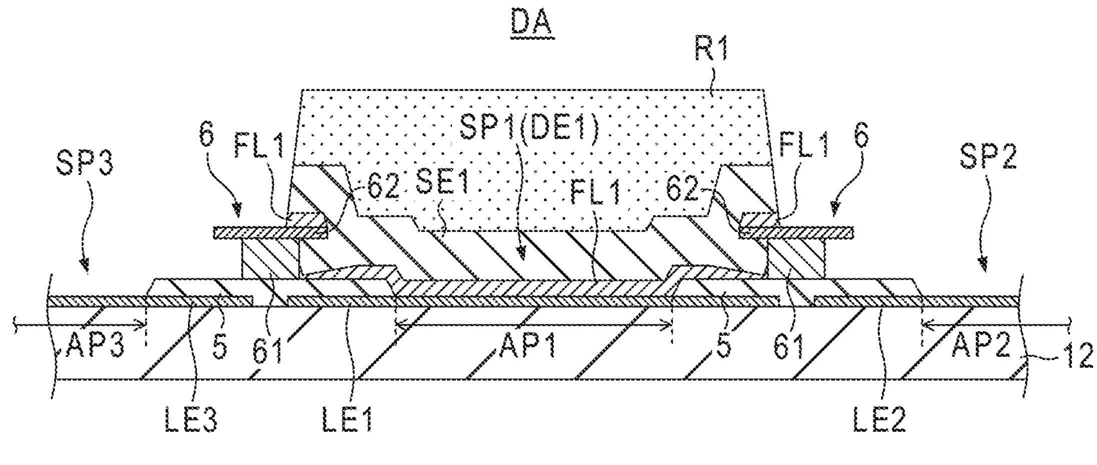
FIG. 12A is a schematic cross-sectional view of the display area and shows a process following FIG. 11A.

Subsequently, as shown in FIG. 12A, the portions of the stacked film FL1 and the sealing layer SE1 exposed from the resist R1 are removed by etching using the resist R1 as a mask. In other words, of the stacked film FL1 and the sealing layer SE1, the portions which overlap the lower electrode LE1 remain, and the other portions are removed. By this process, the display element DE1 is formed in subpixel SP1. For example, this etching includes wet etching and dry etching processes which are performed in order for the sealing layer SE1, the cap layer CP1, the upper electrode UE1 and the organic layer OR1.

Figure 12B:
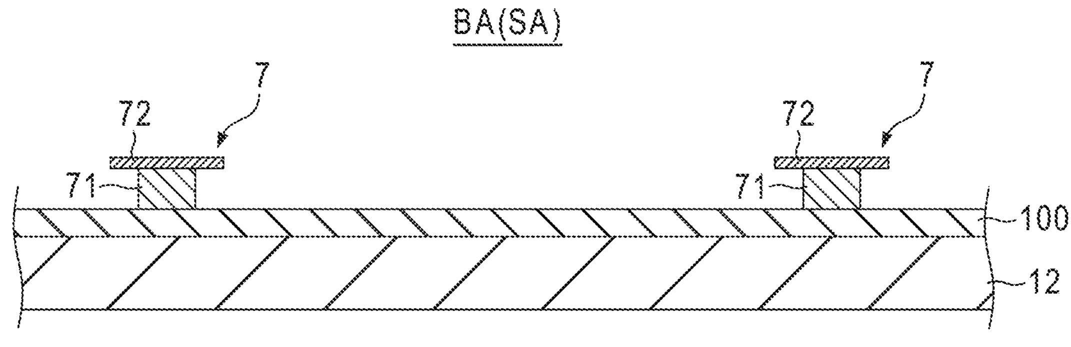
FIG. 12B is a schematic cross-sectional view of the margin area and shows a process following FIG. 11B.

The margin area BA and the surrounding area SA are also exposed to this etching. Thus, as shown in FIG. 12B, the stacked film FL1 and sealing layer SE1 provided in the margin area BA and the surrounding area SA are removed. After this etching, the resist R1 is removed.

The display element DE2 is formed by a procedure similar to that of the display element DE1. To form the display element DE2, first, as shown in FIG. 13A and FIG. 13B, the stacked film FL2 and the sealing layer SE2 are formed in each panel portion PP and the margin area BA (process PR6). The stacked film FL2 includes, as shown in FIG. 3, the organic layer OR2 which is in contact with the lower electrode LE2 through the pixel aperture AP2, the upper electrode UE2 which covers the organic layer OR2 and the cap layer CP2 which covers the upper electrode UE2. The organic layer OR2, the upper electrode UE2 and the cap layer CP2 are formed by vapor deposition. The sealing layer SE2 is formed by CVD.

The stacked film FL2 is divided into a plurality of portions by the partitions 6 and 7 having overhang shapes. The sealing layer SE2 continuously covers the divided portions of the stacked film FL2 and the partitions 6 and 7.

After process PR6, the stacked film FL2 and the sealing layer SE2 are patterned (process PR7). In this patterning, as shown in FIG. 13A, a resist R2 is provided on the sealing layer SE2. The resist R2 covers subpixel SP2 and part of the partition 6 around the subpixel. The resist R2 is not provided in the margin area BA or the surrounding area SA.

Subsequently, as shown in FIG. 14A, the portions of the stacked film FL2 and the sealing layer SE2 exposed from the resist R2 are removed by etching using the resist R2 as a mask. In other words, of the stacked film FL2 and the sealing layer SE2, the portions which overlap the lower electrode LE2 remain, and the other portions are removed. By this process, the display element DE2 is formed in subpixel SP2. For example, this etching includes wet etching and dry etching processes which are performed in order for the sealing layer SE2, the cap layer CP2, the upper electrode UE2 and the organic layer OR2.

The margin area BA is also exposed to this etching. Thus, as shown in FIG. 14B, the stacked film FL2 and sealing layer SE2 provided in the margin area BA and the surrounding area SA are removed. After this etching, the resist R2 is removed.

The display element DE3 is formed by a procedure similar to the procedures of the display elements DE1 and DE2. To form the display element DE3, first, as shown in FIG. 15A and FIG. 15B, the stacked film FL3 and the sealing layer SE3 are formed in each panel portion PP and the margin area BA (process PR8). The stacked film FL3 includes, as shown in FIG. 3, the organic layer OR3 which is in contact with the lower electrode LE3 through the pixel aperture AP3, the upper electrode UE3 which covers the organic layer OR3 and the cap layer CP3 which covers the upper electrode UE3. The organic layer OR3, the upper electrode UE3 and the cap layer CP3 are formed by vapor deposition. The sealing layer SE3 is formed by CVD.

The stacked film FL3 is divided into a plurality of portions by the partitions 6 and 7 having overhang shapes. The sealing layer SE3 continuously covers the divided portions of the stacked film FL3 and the partitions 6 and 7.

After process PR8, the stacked film FL3 and the sealing layer SE3 are patterned (process PR9). In this patterning, as shown in FIG. 15A, a resist R3 is provided on the sealing layer SE3. The resist R3 covers subpixel SP3 and part of the partition 6 around subpixel SP3. The resist R3 is not provided in the margin area BA or the surrounding area SA.

Figures 16A, 16B:
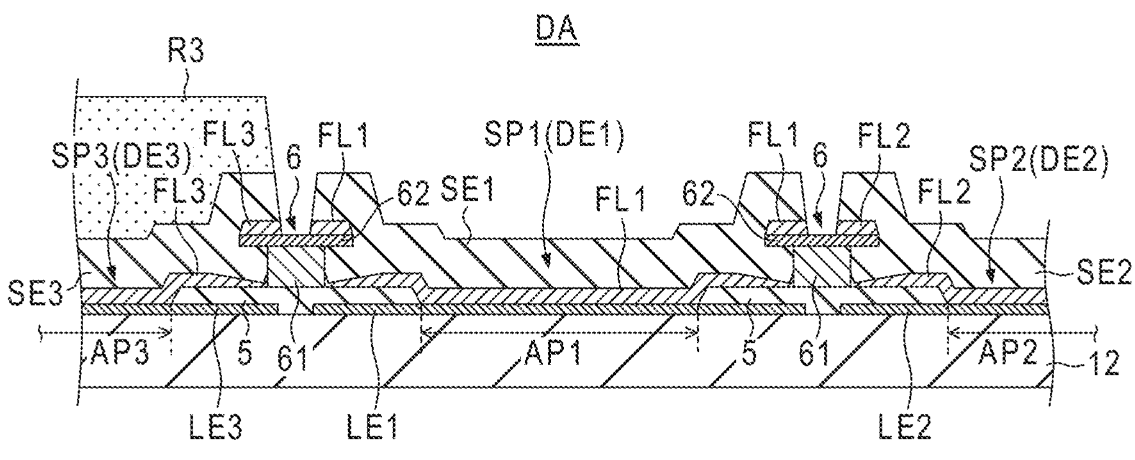
FIG. 16A is a schematic cross-sectional view of the display area and shows a process following FIG. 15A.
FIG. 16B is a schematic cross-sectional view of the margin area and shows a process following FIG. 15B.

Subsequently, as shown in FIG. 16A, the portions of the stacked film FL3 and the sealing layer SE3 exposed from the resist R3 are removed by etching using the resist R3 as a mask. In other words, of the stacked film FL3 and the sealing layer SE3, the portions which overlap the lower electrode LE3 remain, and the other portions are removed. By this process, the display element DE3 is formed in subpixel SP3. For example, this etching includes wet etching and dry etching processes which are performed in order for the sealing layer SE3, the cap layer CP3, the upper electrode UE3 and the organic layer OR3.

The margin area BA and the surrounding area SA are also exposed to this etching. Thus, as shown in FIG. 16B, the stacked film FL3 and sealing layer SE3 provided in the margin area BA and the surrounding area SA are removed. After this etching, the resist R3 is removed.

After the display elements DE1, DE2 and DE3 are formed, the resin layer 13, sealing layer 14 and resin layer 15 shown in FIG. 3 are formed in order for each panel portion PP (process PR10). Further, each panel portion PP is cut out from the mother substrate MB (process PR11). Each of the panel portions PP which have been cut out corresponds to the display panel PNL.

Figure 17:
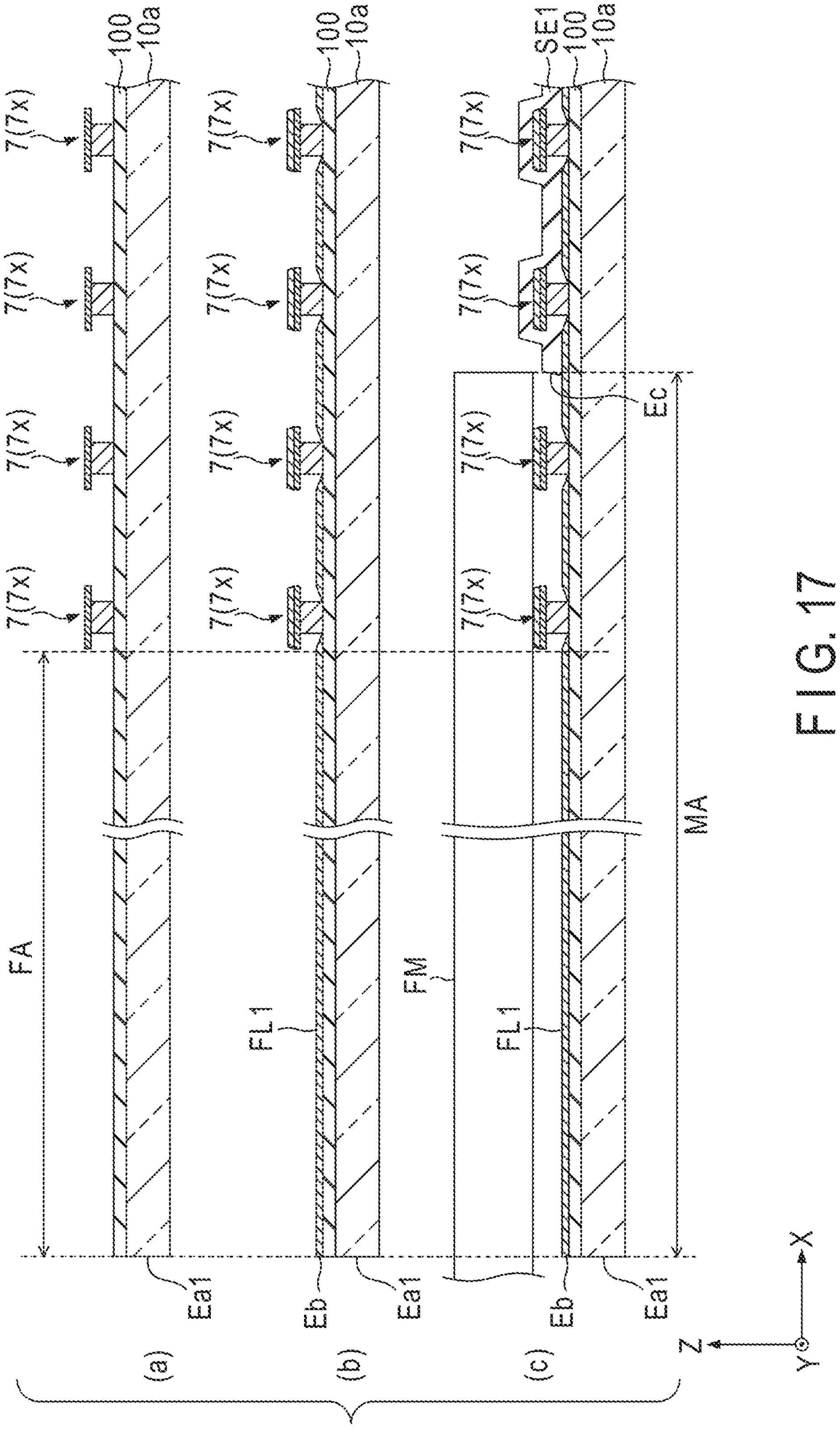
FIG. 17 is a diagram for explaining the details of the process of forming a stacked film and a sealing layer.

FIG. 17 is a diagram for explaining the details of process PR4 for forming the stacked film FL1 and the sealing layer SE1. In FIG. 17, each of (a), (b) and (c) shows a section of the mother substrate MB near the end portion Ea1 of the substrate 10*a*.

FIG. 17(*a*) corresponds to a state before the stacked film FL1 and the sealing layer SE1 are formed, and shows the outer circumferential area FA and the partition 7 (first linear portions 7*x*) provided near the outer circumferential area FA.

FIG. 17(*b*) shows the process of forming the stacked film FL1 by vapor deposition. The stacked film FL1 is formed in the entire substrate 10*a* including the outer circumferential area FA. Thus, an end portion Eb of the stacked film FL1 is aligned with the end portion Ea1 of the substrate 10*a* as seen in plan view.

FIG. 17(*c*) shows the process of forming the sealing layer SE1 by CVD. In this process, the mother substrate MB is provided in a vacuum chamber of a CVD device, and the peripheral portion of the mother substrate MB is pressed by an outer circumferential frame FM. For example, the outer circumferential frame FM presses the peripheral portions near the end portions Ea2, Ea3 and Ea4 as well as the peripheral portion near the end portion Ea1 shown in the figure.

If CVD is performed in the state where the outer circumferential frame FM is provided in this manner, the sealing layer SE1 is not formed in a mask area MA overlapping the outer circumferential frame FM. In the example of FIG. 17, the mask area MA overlaps the entire outer circumferential area FA. Further, the mask area MA also overlaps some first linear portions 7*x* which are close to the end portion Ea1.

When the stacked film FL1 and the sealing layer SE1 are formed by this process, the end portion Ea1 of the substrate 10*a* is spaced apart from an end portion Ec of the sealing layer SE1 as seen in plan view. In the area between these end portions Ea1 and Ec, in other words, in the mask area MA, the stacked film FL1 is exposed from the sealing layer SE1. Further, the end portion Ec of the sealing layer SE1 is located on the center side of the substrate 10*a* (the right side of FIG. 17) relative to the first linear portion 7*x* which is the closest to the end portion Ea1 of the substrate 10*a*. The sealing layer SE1 does not cover some first linear portions 7*x* which are close to the end portion Ea1 of the substrate 10*a*.

FIG. 18 is a schematic cross-sectional view showing an example of the configuration of the vicinities of the end portions Ea1 and Ea2 of the substrate 10*a*. The configuration of the vicinity of the end portion Ea1 shown in the upper part of the figure is similar to that of FIG. 17(*c*). The configuration of the vicinity of the end portion Ea2 shown in the lower part of the figure and the configuration shown in FIG. 17(*c*) are substantially symmetric.

Thus, the end portion Eb of the stacked film FL1 is aligned with the end portion Ea2 near the end portion Ea2 as well. Further, the end portion Ec of the sealing layer SE1 is spaced apart from the end portion Ea2. In the area (mask area MA) between the end portions Ec and Ea2, the stacked film FL1 is exposed from the sealing layer SE1.

Figure 19:
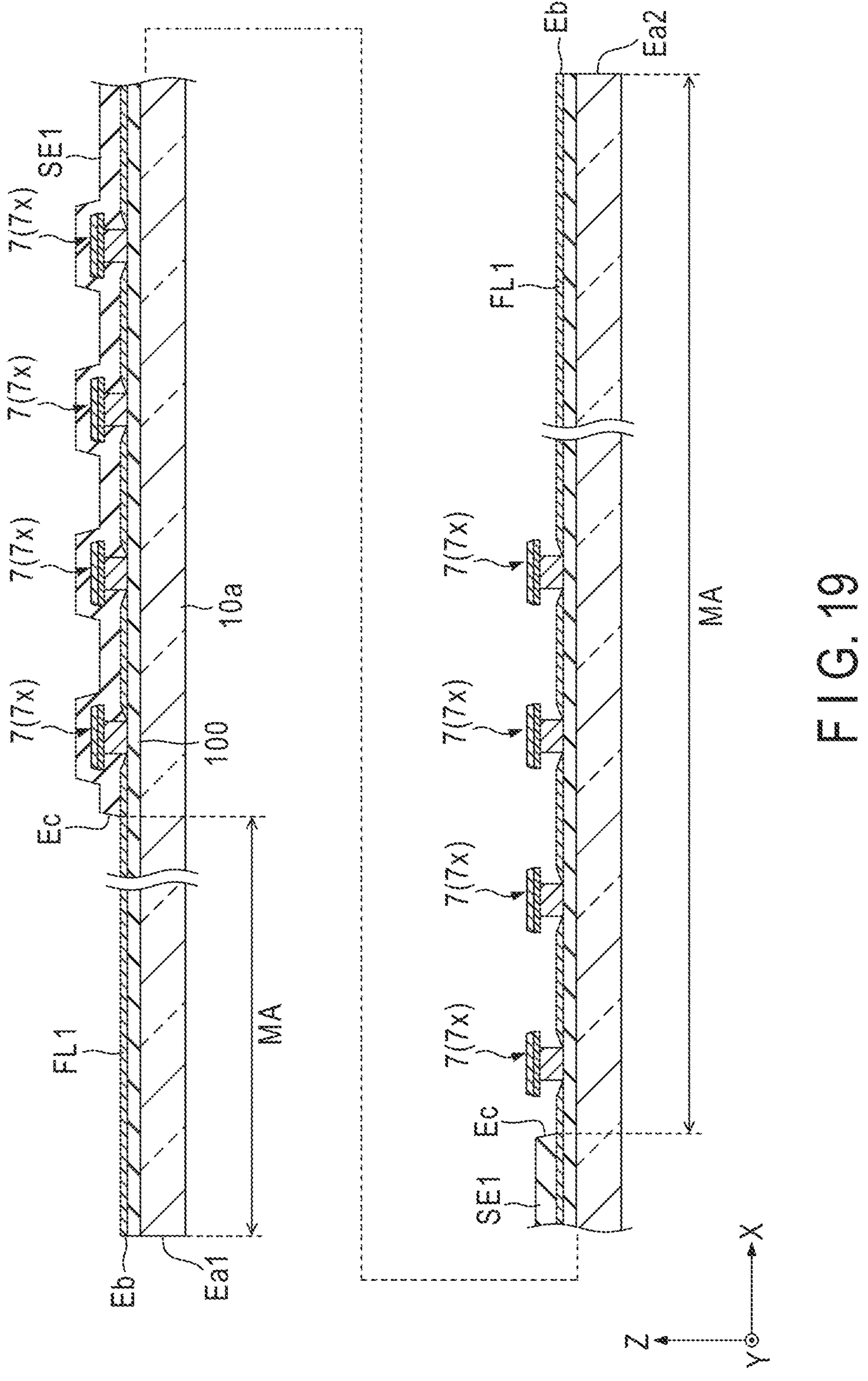
FIG. 19 is a schematic cross-sectional view showing another example of the configuration of the vicinities of the end portions of the substrate.

FIG. 19 is a schematic cross-sectional view showing another example of the configuration of the vicinities of the end portions Ea1 and Ea2 of the substrate 10*a*. Even in a case where the outer circumferential frame FM should be provided such that the mask area MA near the end portion Ea1 has the same width as the mask area MA near the end portion Ea2 as shown in FIG. 18, the positional relationship between the outer circumferential frame FM and the substrate 10*a* may be out of alignment.

In the example of FIG. 19, as the positional relationship between the outer circumferential frame FM and the substrate 10*a* is out of alignment, the mask area MA near the end portion Ea1 is small, and the mask area MA near the end portion Ea2 is large. In this case, the position of the sealing layer SE1 relative to the substrate 10*a* also deviates. In the example of FIG. 19, as shown in the upper part, the sealing layer SE1 covers the first linear portion 7*x* which is the closest to the end portion Ea1, and the end portion Ec of the sealing layer SE1 is located between this first linear portion 7*x* and the end portion Ea1. To the contrary, as shown in the lower part of FIG. 19, near the end portion Ea2, the number of first linear portions 7*x* which are not covered with the sealing layer SE1 is increased compared to the example of FIG. 18.

It should be noted that the range covered with the sealing layer SE1 is not limited to the examples of FIG. 18 and FIG. 19. For example, the sealing layer SE1 may cover both the first linear portion 7*x* which is the closest to the end portion Ea1 and the first linear portion 7*x* which is the closest to the end portion Ea2.

In FIG. 17 to FIG. 19, this specification mainly looks at the configuration of the vicinities of the end portions Ea1 and Ea2 of the substrate 10*a*. However, the stacked film FL1 and the sealing layer SE1 are formed by a similar process in the vicinities of the end portions Ea3 and Ea4. Specifically, the end portion Ec of the sealing layer SE1 is spaced apart from the end portions Ea3 and Ea4 of the substrate 10*a* as seen in plan view. Further, in the areas (mask areas MA) between the end portion Ec and the end portions Ea3 and Ea4, the stacked film FL1 is exposed from the sealing layer SE1. A plurality of second linear portions 7*y* may be provided near the end portions Ea3 and Ea4, and the sealing layer SE may not cover, of these second linear portions 7*y*, the second linear portions 7*y* which are the closest to the end portions Ea3 and Ea4. Further, the sealing layer SE1 may cover at least one of the second linear portion 7*y* which is the closest to the end portion Ea3 and the second linear portion 7*y* which is the closest to the end portion Ea4.

The flow of process PR6 for forming the stacked film FL2 and the sealing layer SE2 and the flow of process PR8 for forming the stacked film FL3 and the sealing layer SE3 are the same as that of process PR4 shown in FIG. 17. Thus, the end portion of the stacked film FL2 formed in process PR6 is aligned with the end portions Ea1, Ea2, Ea3 and Ea4 of the substrate 10*a*. The end portion of the sealing layer SE2 is spaced apart from these end portions Ea1, Ea2, Ea3 and Ea4. Moreover, the end portion of the stacked film FL3 formed in process PR8 is aligned with the end portions Ea1, Ea2, Ea3 and Ea4 of the substrate 10*a*. The end portion of the sealing layer SE3 is spaced apart from these end portions Ea1, Ea2, Ea3 and Ea4.

According to the mother substrate MB and the manufacturing method of the embodiment, the yield at the time of manufacturing can be improved. This effect is explained below using FIG. 20 and FIG. 21.

Figure 20:
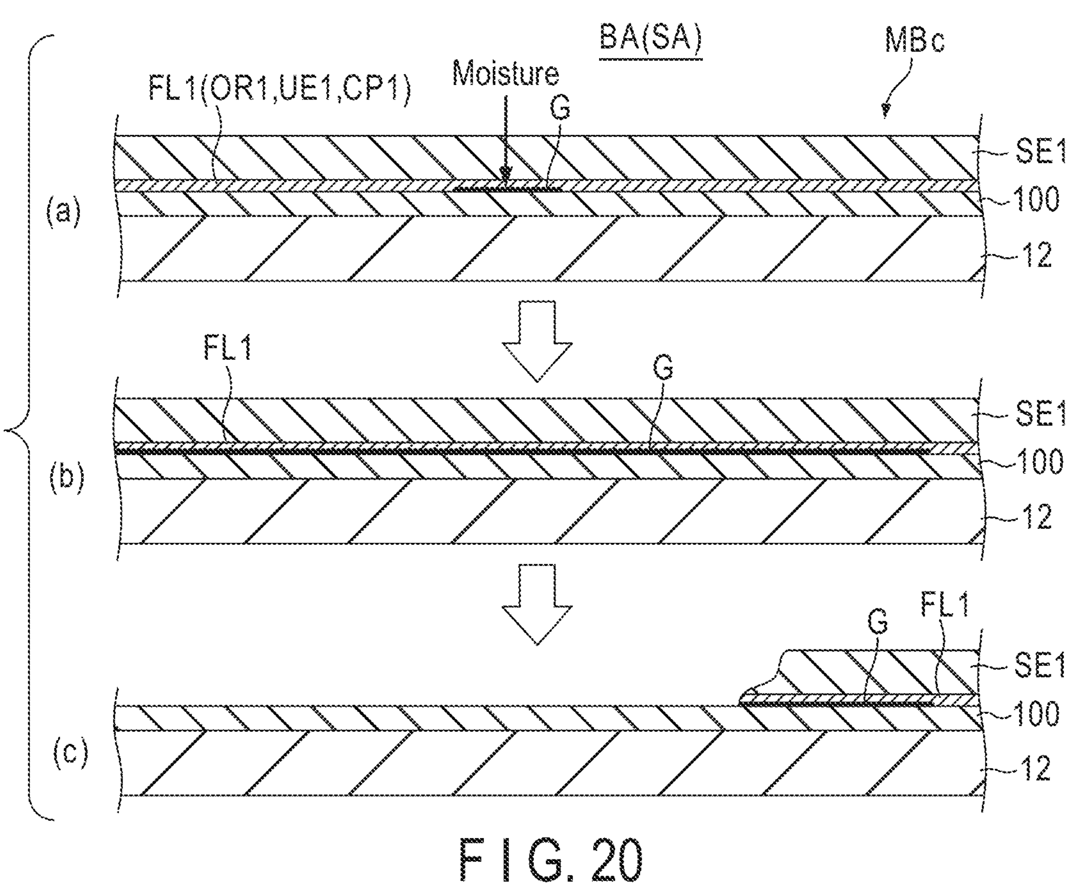
FIG. 20 is a schematic cross-sectional view of the margin area of a mother substrate according to a comparative example.

FIG. 20 is a schematic cross-sectional view of the margin area BA (or the surrounding area SA) of a mother substrate MBc according to a comparative example. The mother substrate MBc is different from the mother substrate MB of the present embodiment in respect that the mother substrate MBc does not comprise the partition 7. The section of FIG. 20(*a*) corresponds to the same process as FIG. 11B. In the margin area BA, a stacked film FL1 and a sealing layer SE1 are formed.

In the patterning of the stacked film FL1 and the sealing layer SE1 (process PR5 of FIG. 8), the mother substrate MB is exposed to washing treatment such as water washing in the air and the development process of a resist. A tiny pinhole may be generated in the sealing layer SE1 formed of an inorganic insulating material. When moisture enters the stacked film FL1 through the pinhole in washing treatment, etc., and reaches the interface between an organic layer OR1 and an inorganic insulating layer 100, an exfoliation portion G in which the organic layer OR1 is raised from the surface of the inorganic insulating layer 100 could be generated.

If moisture interpenetrates the organic layer OR1, as shown in FIG. 20(*b*), the exfoliation portion G expands, and the adhesion between the stacked film FL1 and the inorganic insulating layer 100 is weakened. In this manner, as shown in FIG. 20(*c*), the stacked film FL1 and the sealing layer SE1 may be partly removed. The removed stacked film FL1 and sealing layer SE1 could cause the contamination of chambers, etc., in the manufacturing line. As the contaminated portion requires cleaning, the manufacturing line needs to be stopped.

Figure 21:
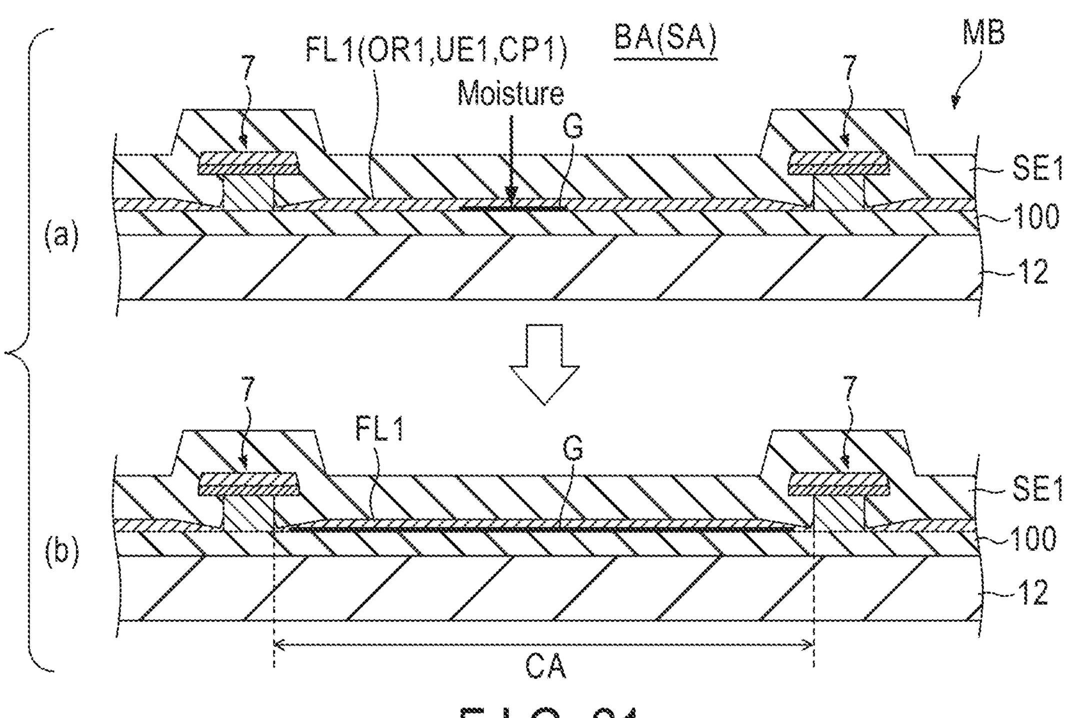
FIG. 21 is a schematic cross-sectional view of the margin area of the mother substrate according to the first embodiment.

FIG. 21 is a schematic cross-sectional view of the margin area BA (or the surrounding area SA) of the mother substrate MB of the embodiment. In FIG. 21(*a*), in the same manner as FIG. 20(*a*), the stacked film FL1 and the sealing layer SE1 are formed in the margin area BA. Further, moisture enters the stacked film FL1, and an exfoliation portion G is generated.

Moreover, in FIG. 21(*b*), the exfoliation portion G is expanded. However, in the embodiment, the partition 7 is provided in the margin area BA and the surrounding area SA, and the stacked film FL1 is divided by the partition 7. Thus, the expansion of the exfoliation portion G is prevented.

Specifically, when the exfoliation portion G is generated between the stacked film FL1 and the inorganic insulating layer 100 as shown in FIG. 21, the expansion of this exfoliation portion G is limited to the inside of the closed area CA. When the exfoliation portion G is formed in the stacked film FL1 located on the partition 7, the expansion of this exfoliation portion G is limited to the area on the partition 7.

In the portion where the exfoliation portion G is generated as shown in FIG. 21(*b*), the stacked film FL1 is suppressed by the sealing layer SE1. Thus, the stacked film FL1 and the sealing layer SE1 are not easily removed.

When the partition 7 consists of the first linear portions 7*x* and the second linear portions 7*y* as shown in FIG. 5, each of the interval of adjacent first linear portions 7*x* (width Wx2 of each closed area CA) and the interval of adjacent second linear portions 7*y* (width Wy2 of each closed area CA) should be preferably less than or equal to 200 μm. By this configuration, the width of the exfoliation portion G in the closed area CA can be suppressed in a narrow range less than or equal to 200 μm, and thus, the stacked film FL1 or the sealing layer SE1 does not easily result in removal.

For example, sputtering is used to form the first and second layers 101 and 102 (see FIG. 9B) patterned into the partition 7. When sputtering is performed, normally, an area of approximately 5 mm from the end portion of the substrate to be processed is masked. In an area of approximately 8 mm from this end portion, the film thickness is unstable. Further, a resist which is used in patterning by photolithography may be thick near the end portion of the substrate in some cases. For this reason, normal patterning is difficult near the end portion of the substrate. In general, the resist near the end portion of the substrate is eliminated.

Because of these factors, the partition 7 cannot be formed near the end portion Ea1, Ea2, Ea3 or Ea4 of the substrate 10*a*. Thus, the outer circumferential area FA shown in FIG. 4 and FIG. 5 is generated. In a case where the sealing layer SE1 is formed for the outer circumferential area FA as well, if an exfoliation portion G is generated in the outer circumferential area FA, the exfoliation portion G is expanded in a wide range as shown in the example of FIG. 20, and the stacked film FL1 and the sealing layer SE1 could be removed.

To the contrary, in the embodiment, the sealing layer SE1 of the outer circumferential area FA has been eliminated. As long as the sealing layer SE1 which is thicker and more rigid than the stacked film FL1 is not present, even if the exfoliation portion G is generated, it is not easily expanded to the surrounding area. As long as the sealing layer SE1 is not present, removal of the sealing layer SE1 itself does not occur. In this manner, the configuration of the embodiment can satisfactorily prevent the removal of the stacked film FL1 and the sealing layer SE1 near the end portions Ea1, E2*a*, Ea3 and Ea4 of the substrate 10*a*.

Further, in the configuration in which the sealing layer SE1 does not cover the first linear portion 7*x* which is the closest to the end portion Ea1 or Ea2 as shown in FIG. 18, even if the position of the sealing layer SE1 deviates as shown in FIG. 19, the area of the sealing layer SE1 formed in the outer circumferential area FA can be suppressed so as to be small. By this configuration, the risk of occurrence of the removal described above can be reduced. In addition, similar effects can be obtained near the end portions Ea3 and Ea4 by designing the vicinities such that the second linear portion 7*y* located in the outermost circumference is not covered with the sealing layer SE1 when the sealing layer SE1 is formed at the correct position.

The effects which are explained above while looking at the stacked film FL1 and the sealing layer SE1 are similarly brought about with regard to the stacked films FL2 and FL3 and the sealing layers SE2 and SE3. In other words, the embodiment can also prevent the removal of the stacked films FL2 and FL3 and the sealing layers SE2 and SE3 and improve the yield.

Second Embodiment

A second embodiment discloses another example which can be applied to processes PR4, PR6 and PR8 for forming stacked films FL1, FL2 and FL3 and sealing layers SE1, SE2 and SE3. The configurations which are not particularly referred to are the same as those of the first embodiment.

Figure 22:
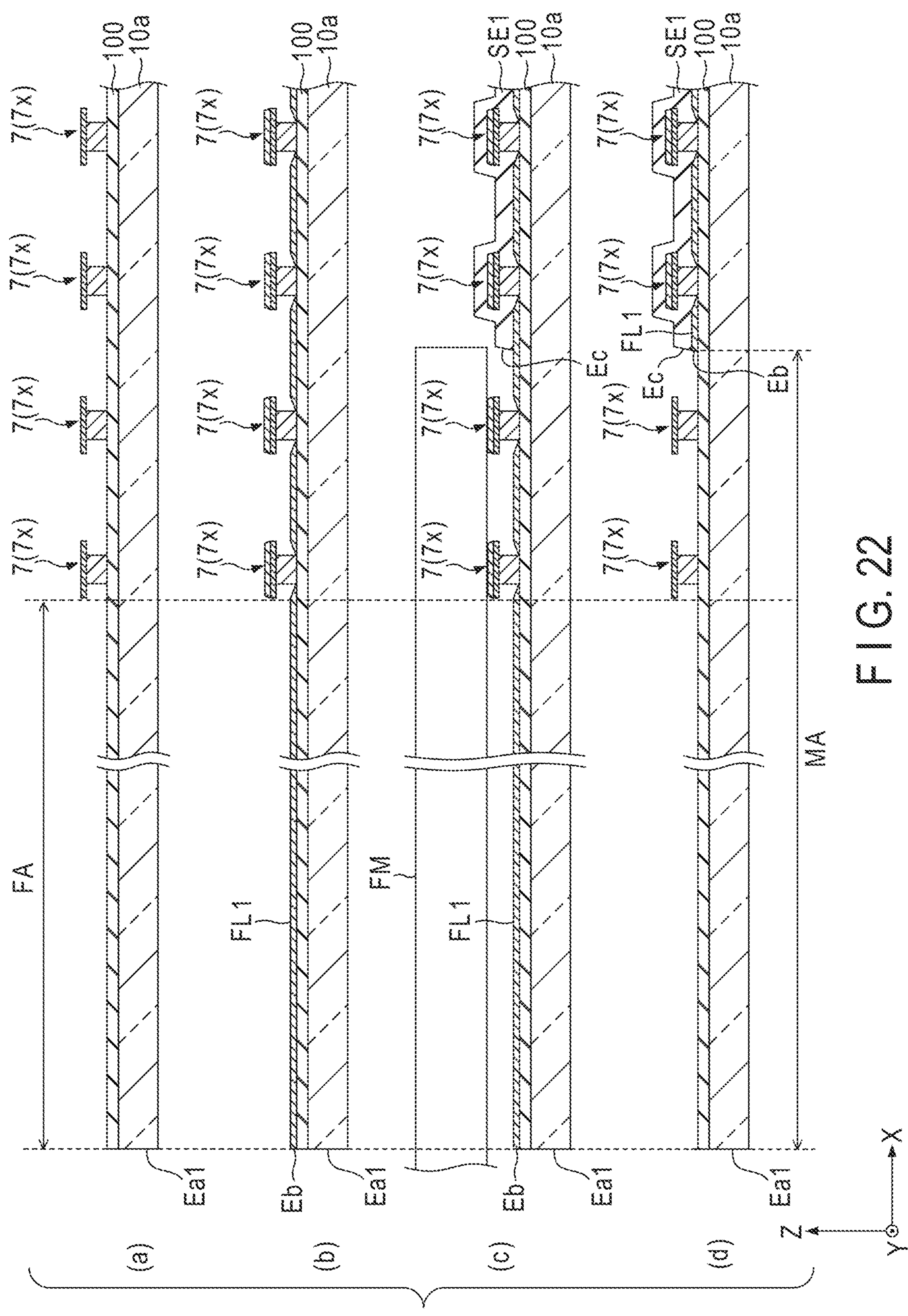
FIG. 22 is a diagram for explaining the details of the process of forming a stacked film and a sealing layer according to a second embodiment.

FIG. 22 is a diagram for explaining the details of process PR4 for forming the stacked film FL1 and the sealing layer SE1 according to the second embodiment. In FIG. 22, each of (a), (b), (c) and (d) shows a section of a mother substrate MB near an end portion Ea1 of a substrate 10*a*. The processes of FIGS. 22(*a*), (*b*) and (*c*) are the same as those of FIGS. 17(*a*), (*b*) and (*c*). In the embodiment, the process of FIG. 22(*d*) is performed after the sealing layer SE1 is formed.

In the process of FIG. 22(*d*), the stacked film FL1 is etched using the sealing layer SE1 as a mask. By this etching, the portion of the stacked film FL1 between the end portion Ea1 of the substrate 10*a* and an end portion Ec of the sealing layer SE1 is eliminated. By this process, the position of an end portion Eb of the stacked film FL1 and the position of the end portion Ec of the sealing layer SE1 are aligned with each other as seen in plan view.

From another viewpoint, each of the end portion Eb of the stacked film FL1 and the end portion Ec of the sealing layer SE1 is spaced apart from the end portion Ea1 of the substrate 10*a* as seen in plan view. The end portions Eb and Ec are located on the center side of the substrate 10*a* (the right side of FIG. 22) relative to the first linear portion 7*x* which is the closest to the end portion Ea1. It should be noted that the etching of FIG. 22(*d*) is performed before the patterning of process PR5 (see FIG. 8).

Figure 23:
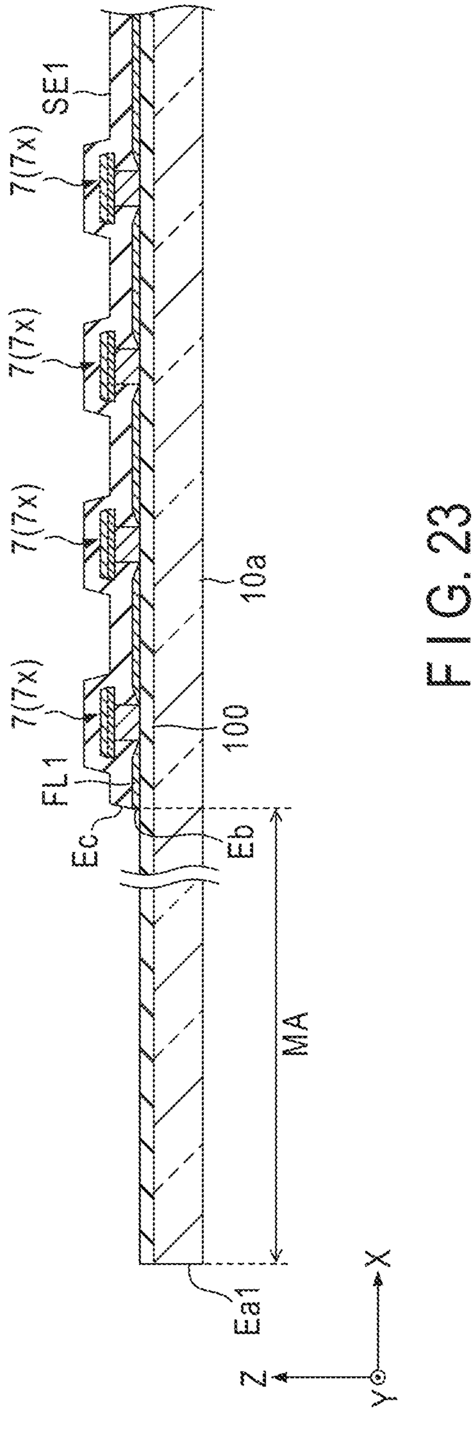
FIG. 23 is a schematic cross-sectional view showing another example of the configuration of the vicinity of an end portion of a substrate according to the second embodiment.

FIG. 23 is a schematic cross-sectional view showing another example of the configuration of the vicinity of the end portion Ea1 of the substrate 10*a*. In FIG. 23, in a manner similar to that of the example of FIG. 19, the first linear portion 7*x* which is the closest to the end portion Ea1 is covered with the sealing layer SE1. The end portion Ec of the sealing layer SE1 is located between the first linear portion 7*x* which is the closest to the end portion Ea1 and the end portion Ea1.

When the stacked film FL1 is etched using this sealing layer SE1 as a mask, the end portion Eb of the stacked film FL1 is located between the first linear portion 7*x* which is the closest to the end portion Ea1 and the end portion Ea1 in a manner similar to that of the end portion Ec.

Although this specification looks at the end portion Ea1 of the substrate 10*a* in FIG. 22 and FIG. 23, a similar configuration can be applied to the vicinities of end portions Ea2, Ea3 and Ea4. Specifically, the end portion Eb of the stacked film FL1 may be aligned with the end portion Ec of the sealing layer SE1 over the whole circumference and may be spaced apart from the end portions Ea1, Ea2, Ea3 and Ea4 of the substrate 10*a*.

The removal of the stacked film FL1 in an outer circumferential area FA where a partition 7 is not formed can be assuredly prevented by eliminating the stacked film FL1 exposed from the sealing layer SE1 in the peripheral portion of the substrate 10*a* as in the case of the embodiment. Effects which are similar to those of the stacked film FL1 are obtained regarding the stacked films FL2 and FL3 as well by performing a process similar to that of FIG. 22(*d*).

In the example of FIG. 22 and FIG. 23, the stacked film FL1 exposed from the sealing layer SE1 is entirely eliminated. As another example, at least one of the layers (the layers constituting a cap layer CP1, an upper electrode UE1 and an organic layer OR1) constituting the stacked film FL1 exposed from the sealing layer SE1 may be eliminated. Even in this case, the risk of removal of the stacked film FL1 can be reduced.

For example, the cap layer CP1 may be etched while maintaining the vacuum state around the mother substrate MB after the formation of the sealing layer SE1. In this case, the organic layer OR1 and upper electrode UE1 exposed from the cap layer CP1 may be left without being removed until the patterning of process PR5 (see FIG. 8).

Regarding the stacked film FL2, similarly, a cap layer CP2 exposed from the sealing layer SE2 may be removed, and each of an organic layer OR2 and upper electrode UE2 exposed from the cap layer CP2 may be left without being removed until the patterning of process PR7. Further, regarding the stacked film FL3, similarly, a cap layer CP3 exposed from the sealing layer SE3 may be removed, and each of an organic layer OR3 and upper electrode UE3 exposed from the cap layer CP3 may be left without being removed until the patterning of process PR9.

Third Embodiment

A third embodiment discloses another example of a configuration which could be applied to a partition 7. The configurations which are not particularly referred to are the same as those of the first embodiment.

FIG. 24 is a schematic plan view of the partition 7 according to the third embodiment. In the example of this figure, the partition 7 has substantially the same pattern as the partition 6 shown in FIG. 2. Specifically, the partition 7 comprises apertures AP71, AP72 and AP73 which have the same or similar shapes to the apertures AP61, AP62 and AP63 of the partition 6 shown in FIG. 2. The areas of the inside of the apertures AP71, AP72 and AP73 correspond to closed areas CA similar to those of the first embodiment.

The positional relationship of the apertures AP71, AP72 and AP73 is the same as that of the apertures AP61, AP62 and AP63. For example, the sizes of the apertures AP71, AP72 and AP73 are the same as those of the apertures AP61, AP62 and AP63. However, the sizes are not limited to this example.

If the shapes of the partitions 6 and 7 are largely different from each other, there is a possibility that nonuniformity occurs in a plane of a mother substrate MB in etching when the first and second layers 101 and 102 shown in FIG. 9A and FIG. 9B are patterned. To the contrary, when the partition 7 has substantially the same pattern as the partition 6 as in the case of the embodiment, the uniformity in etching at the time of patterning the first and second layers 101 and 102 can be improved.

It should be noted that the shape of the partition 7 is not limited to the shapes disclosed in the first and third embodiments. For example, the partition 7 may not necessarily form the closed areas CA. As another example, the partition 7 may consist of a plurality of linear portions provided parallel to each other, and these linear portions may not be connected to each other. Even this configuration suppresses the expansion of the exfoliation portion G in the arrangement direction of the linear portions.

Further, the partition 7 provided in the margin area BA and the partition 7 provided in the surrounding area SA may have different shapes. For example, the partition 7 having the shape shown in FIG. 5 may be provided in the margin area BA, and the partition 7 having the shape shown in FIG. 24 may be provided in the surrounding area SA. As yet another example, the partition 7 may not be provided in the surrounding area SA.

The partitions 6 and 7 may not be necessarily formed by the same process at the same time and may be formed by difference processes. In this case, the materials of the partitions 6 and 7 may be different from each other.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A manufacturing method of a display device, including:

preparing a substrate including a plurality of panel portions each of which includes a display area, and a margin area around the panel portions;

forming a plurality of lower electrodes including a first lower electrode in the display area;

forming a rib comprising a plurality of pixel apertures including a first pixel aperture overlapping the first lower electrode;

forming a first partition including a first lower portion and a first upper portion comprising an end portion which protrudes from a side surface of the first lower portion in the margin area;

forming a first stacked film including a first organic layer which is in contact with the lower electrodes through the pixel apertures, and a first upper electrode which covers the first organic layer; and forming a first sealing layer with an inorganic insulating material which covers the first stacked film, wherein the first stacked film is formed in an entire of the substrate and is divided into a plurality of portions by the first partition, the first sealing layer continuously covers the plurality of portions, an end portion of the substrate is spaced apart from an end portion of the first sealing layer as seen in plan view, and the first stacked film is exposed from the first sealing layer in an area between the end portion of the substrate and the end portion of the first sealing layer.

2. The manufacturing method of claim 1, wherein the first partition comprises a plurality of linear portions arranged in the margin area, and the end portion of the first sealing layer is located on a center side of the substrate relative to a linear portion which is the closest to the end portion of the substrate among the plurality of linear portions.

3. The manufacturing method of claim 1, wherein the first partition comprises a plurality of linear portions arranged in the margin area, and the end portion of the first sealing layer is located between the end portion of the substrate and a linear portion which is the closest to the end portion of the substrate among the plurality of linear portions.

4. The manufacturing method of claim 1, further including eliminating at least one of a plurality of layers which constitute the first stacked film from a portion of the first stacked film between the end portion of the substrate and the end portion of the first sealing layer by using the first sealing layer as a mask.

5. The manufacturing method of claim 1, wherein the first stacked film further includes a first cap layer having a refractive index different from the first sealing layer and covering the first upper electrode.

6. The manufacturing method of claim 1, further including forming a second partition in the display area before forming the first stacked film, the second partition including a second lower portion located on the rib and a second upper portion comprising an end portion which protrudes from a side surface of the second lower portion.

7. The manufacturing method of claim 1, further including patterning the first stacked film and the first sealing layer such that portions of the first stacked film and the first sealing layer overlapping the first lower electrode remain, and other portions of the first stacked film and the first sealing layer are removed.

8. The manufacturing method of claim 7, wherein the plurality of lower electrodes include a second lower electrode, and the plurality of pixel apertures include a second pixel aperture, the manufacturing method further includes:

forming a second stacked film including a second organic layer which is in contact with the second lower electrode through the second pixel aperture and a second upper electrode which covers the second organic layer, after the patterning of the first stacked film and the first sealing layer; and forming a second sealing layer with an inorganic insulating material which covers the second stacked film.

9. The manufacturing method of claim 8, further including patterning the second stacked film and the second sealing layer such that portions of the second stacked film and the second sealing layer overlapping the second lower electrode remain, and other portions of the second stacked film and the second sealing layer are removed.

10. The manufacturing method of claim 9, wherein the plurality of lower electrodes include a third lower electrode, and the plurality of pixel apertures include a third pixel aperture, the manufacturing method further includes:

forming a third stacked film including a third organic layer which is in contact with the third lower electrode through the third pixel aperture and a third upper electrode which covers the third organic layer, after the patterning of the second stacked film and the second sealing layer; and forming a third sealing layer with an inorganic insulating material which covers the third stacked film.

11. A mother substrate for a display device, comprising:

a substrate including a plurality of panel portions each of which includes a display area, and a margin area around the panel portions;

a lower electrode provided in the display area;

a rib comprising a pixel aperture overlapping the lower electrode;

a first partition formed in the margin area and including a first lower portion and a first upper portion comprising an end portion which protrudes from a side surface of the first lower portion;

a stacked film including an organic layer which is in contact with the lower electrode through the pixel aperture, and an upper electrode which covers the organic layer; and a sealing layer formed of an inorganic insulating material which covers the stacked film, wherein the stacked film is formed in the panel portions and the margin area and is divided into a plurality of portions by the first partition, the sealing layer continuously covers the plurality of portions, an end portion of the substrate is spaced apart from an end portion of the sealing layer as seen in plan view, and the stacked film is exposed from the sealing layer in an area between the end portion of the substrate and the end portion of the sealing layer.

12. The mother substrate of claim 11, wherein the first partition comprises a plurality of linear portions arranged in the margin area, and the end portion of the sealing layer is located on a center side of the substrate relative to a linear portion which is the closest to the end portion of the substrate among the plurality of linear portions.

13. The mother substrate of claim 11, wherein the first partition comprises a plurality of linear portions arranged in the margin area, and the end portion of the sealing layer is located between the end portion of the substrate and a linear portion which is the closest to the end portion of the substrate among the plurality of linear portions.

14. The mother substrate of claim 11, wherein the stacked film further includes a cap layer having a refractive index different from the sealing layer and covering the upper electrode.

15. The mother substrate of claim 11, further comprising a second partition provided in the display area and including a second lower portion located on the rib and a second upper portion comprising an end portion which protrudes from a side surface of the second lower portion, wherein the stacked film is divided into a plurality of portions by the second partition in the display area.

16. A mother substrate for a display device, comprising:

a substrate including a plurality of panel portions each of which includes a display area, and a margin area around the panel portions;

a lower electrode provided in the display area;

a rib comprising a pixel aperture overlapping the lower electrode;

a first partition formed in the margin area and including a first lower portion and a first upper portion comprising an end portion which protrudes from a side surface of the first lower portion;

a stacked film including an organic layer which is in contact with the lower electrode through the pixel aperture, and an upper electrode which covers the organic layer; and a sealing layer formed of an inorganic insulating material which covers the stacked film, wherein the stacked film is formed in the panel portions and the margin area and is divided into a plurality of portions by the first partition, the sealing layer continuously covers the plurality of portions, an end portion of the stacked film is aligned with an end portion of the sealing layer as seen in plan view, and each of the end portion of the stacked film and the end portion of the sealing layer is spaced apart from an end portion of the substrate as seen in plan view.

17. The mother substrate of claim 16, wherein the first partition comprises a plurality of linear portions arranged in the margin area, and the end portion of the stacked film and the end portion of the sealing layer are located on a center side of the substrate relative to a linear portion which is the closest to the end portion of the substrate among the plurality of linear portions.

18. The mother substrate of claim 16, wherein the first partition comprises a plurality of linear portions arranged in the margin area, and the end portion of the stacked film and the end portion of the sealing layer are located between the end portion of the substrate and a linear portion which is the closest to the end portion of the substrate among the plurality of linear portions.

19. The mother substrate of claim 16, wherein the stacked film further includes a cap layer having a refractive index different from the sealing layer and covering the upper electrode.

20. The mother substrate of claim 16, further comprising a second partition provided in the display area and including a second lower portion located on the rib and a second upper portion comprising an end portion which protrudes from a side surface of the second lower portion, and the stacked film is divided into a plurality of portions by the second partition in the display area.

* * * * *